(12) United States Patent
Peng et al.

(10) Patent No.: US 11,916,074 B2
(45) Date of Patent: Feb. 27, 2024

(54) DOUBLE RULE INTEGRATED CIRCUIT LAYOUTS FOR A DUAL TRANSMISSION GATE

(71) Applicant: Taiwan Semiconductor Manufacturing Co., Ltd., Hsinchu (TW)

(72) Inventors: Shih-Wei Peng, Hsinchu (TW); Hui-Zhong Zhuang, Kaohsiung (TW); Jiann-Tyng Tzeng, Hsinchu (TW); Li-Chun Tien, Tainan (TW); Pin-Dai Sue, Tainan (TW); Wei-Cheng Lin, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/875,060

(22) Filed: Jul. 27, 2022

(65) Prior Publication Data
US 2022/0359512 A1    Nov. 10, 2022

Related U.S. Application Data

(60) Continuation of application No. 17/120,839, filed on Dec. 14, 2020, now Pat. No. 11,476,250, which is a
(Continued)

(51) Int. Cl.
*H01L 21/70* (2006.01)
*H01L 27/092* (2006.01)
*H03K 17/687* (2006.01)

(52) U.S. Cl.
CPC ....... *H01L 27/092* (2013.01); *H03K 17/6872* (2013.01)

(58) Field of Classification Search
CPC .................. H01L 27/092; H03K 17/6872
(Continued)

(56) References Cited

U.S. PATENT DOCUMENTS

| | | | |
|---|---|---|---|
| 4,860,240 A * | 8/1989 | Hartley | G06F 7/525 |
| | | | 708/625 |
| 5,581,105 A | 12/1996 | Huang | |

(Continued)

FOREIGN PATENT DOCUMENTS

| | | |
|---|---|---|
| CN | 103594422 | 2/2014 |
| CN | 106256021 | 12/2016 |

(Continued)

OTHER PUBLICATIONS

Advanced VSLI Design/CMOS Circuit Design, Nov. 2000, University of Maryland Baltimore County (UMBC) URL: httphttp://ece-research.unm.edu/jimp/vlsi/slides/chap5_1.pdf, archived at http://www.archive.org, May 8, 2018, accessed Feb. 27, 2019; 27 pages.

(Continued)

*Primary Examiner* — Phuc T Dang
(74) *Attorney, Agent, or Firm* — Sterne, Kessler, Goldstein & Fox P.L.L.C.

(57) ABSTRACT

Exemplary embodiments for an exemplary dual transmission gate and various exemplary integrated circuit layouts for the exemplary dual transmission gate are disclosed. These exemplary integrated circuit layouts represent double-height, also referred to as double rule, integrated circuit layouts. These double rule integrated circuit layouts include a first group of rows from among multiple rows of an electronic device design real estate and a second group of rows from among the multiple rows of the electronic device design real estate to accommodate a first metal layer of a semiconductor stack. The first group of rows can include a first pair of complementary metal-oxide-semiconductor (Continued)

field-effect (CMOS) transistors, such as a first p-type metal-oxide-semiconductor field-effect (PMOS) transistor and a first n-type metal-oxide-semiconductor field-effect (NMOS) transistor, and the second group of rows can include a second pair of CMOS transistors, such as a second PMOS transistor and a second NMOS transistor. These exemplary integrated circuit layouts disclose various configurations and arrangements of various geometric shapes that are situated within an oxide diffusion (OD) layer, a polysilicon layer, a metal diffusion (MD) layer, the first metal layer, and/or a second metal layer of a semiconductor stack. In the exemplary embodiments to follow, the various geometric shapes within the first metal layer are situated within the multiple rows of the electronic device design real estate and the various geometric shapes within the OD layer, the polysilicon layer, the MD layer, and/or the second metal layer are situated within multiple columns of the electronic device design real estate.

20 Claims, 35 Drawing Sheets

Related U.S. Application Data continuation of application No. 16/727,456, filed on Dec. 26, 2019, now Pat. No. 10,868,008, which is a division of application No. 16/021,847, filed on Jun. 28, 2018, now Pat. No. 10,522,542.

(58) Field of Classification Search
USPC ........................................................ 257/369
See application file for complete search history.

(56) References Cited

U.S. PATENT DOCUMENTS

| | | | |
|---|---|---|---|
| 5,701,021 A | 12/1997 | Yin | |
| 6,097,042 A | 8/2000 | Lee | |
| 6,426,652 B1 * | 7/2002 | Greenhill | H03K 19/0948 |
| | | | 326/119 |
| 7,271,452 B2 | 9/2007 | Arai | |
| 8,274,319 B2 | 9/2012 | Maeno | |
| 9,564,897 B1 | 2/2017 | Berzins et al. | |
| 10,236,873 B2 | 3/2019 | Cical et al. | |
| 2006/0289945 A1 | 12/2006 | Nii | |
| 2010/0252890 A1 | 10/2010 | Becker | |
| 2014/0048889 A1 | 2/2014 | Bitterlich | |
| 2015/0009750 A1 | 1/2015 | Schaefer et al. | |
| 2015/0325514 A1 | 11/2015 | Mojumder et al. | |
| 2015/0347659 A1 * | 12/2015 | Chiang | H01L 27/092 |
| | | | 716/55 |
| 2016/0005763 A1 | 1/2016 | Masuoka et al. | |
| 2016/0321389 A1 | 11/2016 | Myers | |
| 2016/0336316 A1 | 11/2016 | Chen | |
| 2017/0371995 A1 | 12/2017 | Correale, Jr. et al. | |
| 2018/0006009 A1 | 1/2018 | Lin et al. | |
| 2018/0138200 A1 | 5/2018 | Kim et al. | |
| 2018/0151567 A1 | 5/2018 | Lin et al. | |
| 2019/0067265 A1 | 2/2019 | Jeong et al. | |
| 2020/0135732 A1 | 4/2020 | Peng et al. | |
| 2021/0098453 A1 | 4/2021 | Peng et al. | |

FOREIGN PATENT DOCUMENTS

| | | |
|---|---|---|
| CN | 106560999 | 4/2017 |
| DE | 10-2016 119 037 A1 | 1/2018 |
| JP | H07242168 A | 9/1996 |
| JP | H08242168 A | 9/1996 |
| JP | 2005191657 A | 7/2005 |
| KR | 20170128529 A | 11/2017 |

OTHER PUBLICATIONS

Sarkar et al., Low Power VLSI Design, Berlin/Boston: de Gruyter, 2016; pp. 140-143, ISBN 978-3-11-045526-7; 4 pages.

* cited by examiner

DOUBLE RULE INTEGRATED CIRCUIT LAYOUTS FOR A DUAL TRANSMISSION GATE

CROSS-REFERENCE TO RELATED APPLICATIONS

The present application is a continuation of U.S. patent application Ser. No. 17/120,839, filed Dec. 14, 2020 now U.S. patent Ser. No. 11/476,250, which is a continuation of U.S. patent application Ser. No. 16/727,456, filed Dec. 26, 2019, now U.S. Pat. No. 10,868,008, which is a divisional of U.S. patent application Ser. No. 16/021,847, filed Jun. 28, 2018, now U.S. Pat. No. 10,522,542, each of which is incorporated herein by reference in its entirety.

BACKGROUND

A transmission gate, sometimes referred to as an analog switch, represents an electronic element that selectively passes a signal from an input terminal to an output terminal. Often times, the transmission gate includes a p-type metal-oxide-semiconductor field-effect (PMOS) transistor and a n-type metal-oxide-semiconductor field-effect (NMOS) transistor. The PMOS transistor and NMOS transistor can be complementary biased using a complementary clocking signal such that the PMOS transistor and NMOS transistor are collectively conducting, namely, in an on-state, to pass the signal from the input terminal to the output terminal. Alternatively, the complementary clocking signal can cause the PMOS transistor and NMOS transistor to be non-conducting, namely, in an off-state, to prevent the signal from being passed from the input terminal to the output terminal.

In some situations, the complementary clocking signal can also be used to bias another transmission gate to form a dual transmission gate. This dual transmission gate can include a first input terminal corresponding to the transmission gate, a second input terminal corresponding to this other transmission gate, and a common output terminal shared by the transmission gate and this other transmission gate. In these situations, the complementary clocking signal can cause the transmission gate to pass the signal from the first input terminal to the common output terminal and can prevent this other transmission gate from passing the second signal from the second input terminal to the common output terminal. Alternatively, the complementary clocking signal can prevent the transmission gate from passing the signal from the first input terminal to the common output terminal and cause this other transmission gate to pass the second signal from the second input terminal to the common output terminal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
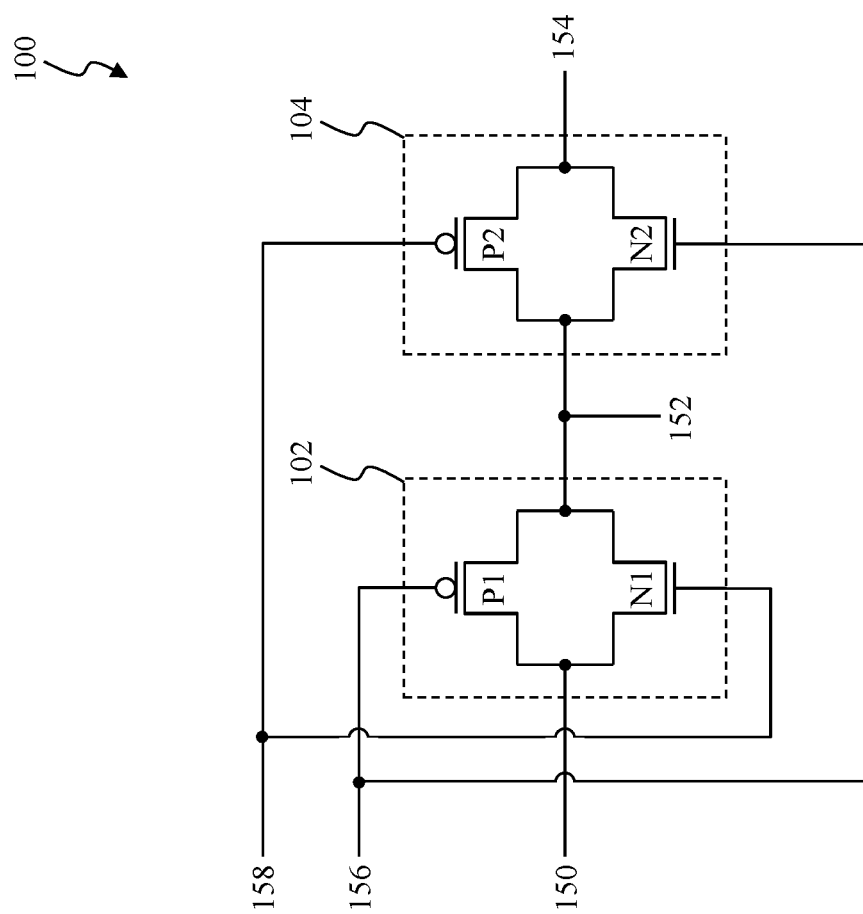
FIG. 1 illustrates a schematic diagram of an exemplary dual transmission gate according to an exemplary embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition does not in itself dictate a relationship between the various embodiments and/or configurations described.

Overview

Exemplary embodiments for an exemplary dual transmission gate and various exemplary integrated circuit layouts for the exemplary dual transmission gate are disclosed. These exemplary integrated circuit layouts represent double-height, also referred to as double rule, integrated circuit layouts. These double rule integrated circuit layouts include a first group of rows from among multiple rows of an electronic device design real estate and a second group of rows from among the multiple rows of the electronic device design real estate to accommodate a first metal layer of a semiconductor stack. The first group of rows can include a first pair of complementary metal-oxide-semiconductor field-effect (CMOS) transistors, such as a first p-type metal-oxide-semiconductor field-effect (PMOS) transistor and a first n-type metal-oxide-semiconductor field-effect (NMOS) transistor, and the second group of rows can include a second pair of CMOS transistors, such as a second PMOS transistor and a second NMOS transistor. These exemplary integrated circuit layouts disclose various configurations and arrangements of various geometric shapes that are situated within an oxide diffusion (OD) layer, a polysilicon layer, a metal diffusion (MD) layer, the first metal layer, and/or a second metal layer of a semiconductor stack. In the exemplary embodiments to follow, the various geometric shapes within the first metal layer are situated within the multiple rows of the electronic device design real estate and the various geometric shapes within the OD layer, the polysilicon layer, the MD layer, and/or the second metal layer are situated within multiple columns of the electronic device design real estate.

Exemplary Dual Transmission Gate

FIG. 1 illustrates a schematic diagram of an exemplary dual transmission gate according to an exemplary embodiment of the present disclosure. In the exemplary embodiment illustrated in FIG. 1, a dual transmission gate 100 includes a first transmission gate 102 to selectively provide a first signal pathway between a first terminal 150 and a second terminal 152 and a second transmission gate 104 to selectively provide a second signal pathway between the second terminal 152 and a third terminal 154. In an exemplary embodiment, the first signal pathway and the second signal pathway represent bi-directional signal pathways. In this exemplary embodiment, the first transmission gate 102 can selectively route various signals between the first terminal 150 and the second terminal 152 and the second transmission gate 104 can selectively route various signals between the second terminal 152 and the third terminal 154. As illustrated in FIG. 1, the first transmission gate 102 includes a first p-type metal-oxide-semiconductor field-effect (PMOS) transistor P1 and a first n-type metal-oxide-semiconductor field-effect (NMOS) transistor N1 and the second transmission gate 104 includes a second PMOS transistor P2 and a second NMOS transistor N2.

The first transmission gate 102 selectively provides the first signal pathway in response to a first clocking signal 156 being at a first logical level, such as a logical zero, and a second clocking signal 158 being at a second logical level, such as a logical one. In an exemplary embodiment, the first clocking signal 156 and the second clocking signal 158 represent a differential clocking signal with the first clocking signal 156 being a complement of the second clocking signal 158. In the exemplary embodiment illustrated in FIG. 1, the PMOS transistor P1 is conducting, namely, in an on-state, when the first clocking signal 156 is at the first logical level, such as the logical zero, and the NMOS transistor N1 is conducting, namely, in the on-state, when the second clocking signal 158 is at the second logical level, such as the logical one, to provide the first signal pathway between the first terminal 150 and the second terminal 152. In this situation, the PMOS transistor P2 is non-conducting, namely, in an off-state, when the second clocking signal 158 is at the second logical level, such as the logical one, and the NMOS transistor N2 is non-conducting, namely, in the off-state, when the first clocking signal 156 is at the first logical level, such as the logical zero.

The second transmission gate 104 selectively provides the second signal pathway in response to the first clocking signal 156 being at the second logical level, such as the logical one, and the second clocking signal 158 being at the first logical level, such as the logical zero. In the exemplary embodiment illustrated in FIG. 1, the PMOS transistor P2 is conducting, namely, in the on-state, when the second clocking signal 158 is at the first logical level, such as the logical zero, and the NMOS transistor N2 is conducting, namely, in the on-state, when the first clocking signal 156 is at the second logical level, such as the logical one, to provide the second signal pathway between the second terminal 152 and the third terminal 154. In this situation, the PMOS transistor P1 is non-conducting, namely, in an off-state, when the first clocking signal 156 is at the second logical level, such as the logical one, and the NMOS transistor N1 is non-conducting, namely, in the off-state, when the second clocking signal 158 is at the first logical level, such as the logical zero.

Exemplary Integrated Circuit Layouts for the Exemplary Dual Transmission Gate

FIG. 2 through FIG. 32 illustrate various exemplary integrated circuit layouts for the exemplary dual transmission gate according to exemplary embodiments of the present disclosure. FIG. 2 through FIG. 32 illustrate various exemplary integrated circuit layouts for an exemplary dual transmission gate, such as the dual transmission gate 100 to provide an example. The exemplary integrated circuit layouts for the exemplary dual transmission gate to be described below include various geometric shapes that are situated within one or more interconnection layers, such as an oxide diffusion (OD) layer, a polysilicon layer, a metal diffusion (MD) layer, a first metal layer, and/or a second metal layer to provide some examples, of a semiconductor stack. As to be described in more detail below, these geometric shapes can be situated within an electronic device design real estate. Herein, the terms "first metal layer" and "second metal layer" are merely used to distinguish between metal layers of the semiconductor layer stack. The terms "first metal layer" and "second metal layer" need not be the first metal layer and the second metal layer, respectively, of the semiconductor layer stack. Rather, those skilled in the relevant art(s) will recognize the terms "first metal layer" and "second metal layer" can be any two metal layers of the semiconductor layer stack. In an exemplary embodiment, the first metal layer and the second metal layer represent a METAL 1 layer and a METAL 2 layer within the semiconductor stack.

As to be illustrated in FIG. 2 through FIG. 32, the electronic device design real estate can be characterized as including multiple rows along a first direction 250, such as along an "x" axis of a Cartesian coordinate system, and multiple columns along a second direction 252, such as along a "y" axis of the Cartesian coordinate system, for placement of the various geometric shapes of the exemplary integrated circuit layouts. In an exemplary embodiment, the OD layer and/or the first metal layer of the semiconductor stack are situated along the multiple rows in the first direction 250. In this exemplary embodiment, the one or more polysilicon layers, the MD layer and/or the second metal layer of the semiconductor stack are situated along the multiple columns in the second direction 252. In some situations, a cell structure of the electronic device design real estate can include a limited number of rows along the first direction 250 to accommodate the first metal layer. For example, the cell structure of the electronic device design real estate can include can include three rows, such as the rows 202.1 through 202.3 or the rows 202.4 through 202.6 to provide some examples, along the first direction 250 to form a single-height integrated circuit layout. In this example, the single-height integrated circuit layout can accommodate the first metal layer using these three rows. However, to accommodate the first metal layer using more rows, the exemplary integrated circuit layouts illustrated in FIG. 2 through FIG. 32 utilize double-height, also referred to as double rule, integrated circuit layouts to increase the number of rows along the first direction 250. As to be described in more detail below, these double rule integrated circuit layouts include a first group of rows from among the multiple rows and a second group of rows from among the multiple rows which can be both utilized to accommodate the first metal layer. As to be described in further detail below, the first group of rows can include a first pair of complementary metal-oxide-semiconductor field-effect (CMOS) transistors, such as the PMOS transistor P1 and the NMOS transistor N1 as described in FIG. 1, and the second group of rows can include a second pair of CMOS transistors, such as the PMOS transistor P2 and the NMOS transistor N2 as described in FIG. 1.

Figure 2:
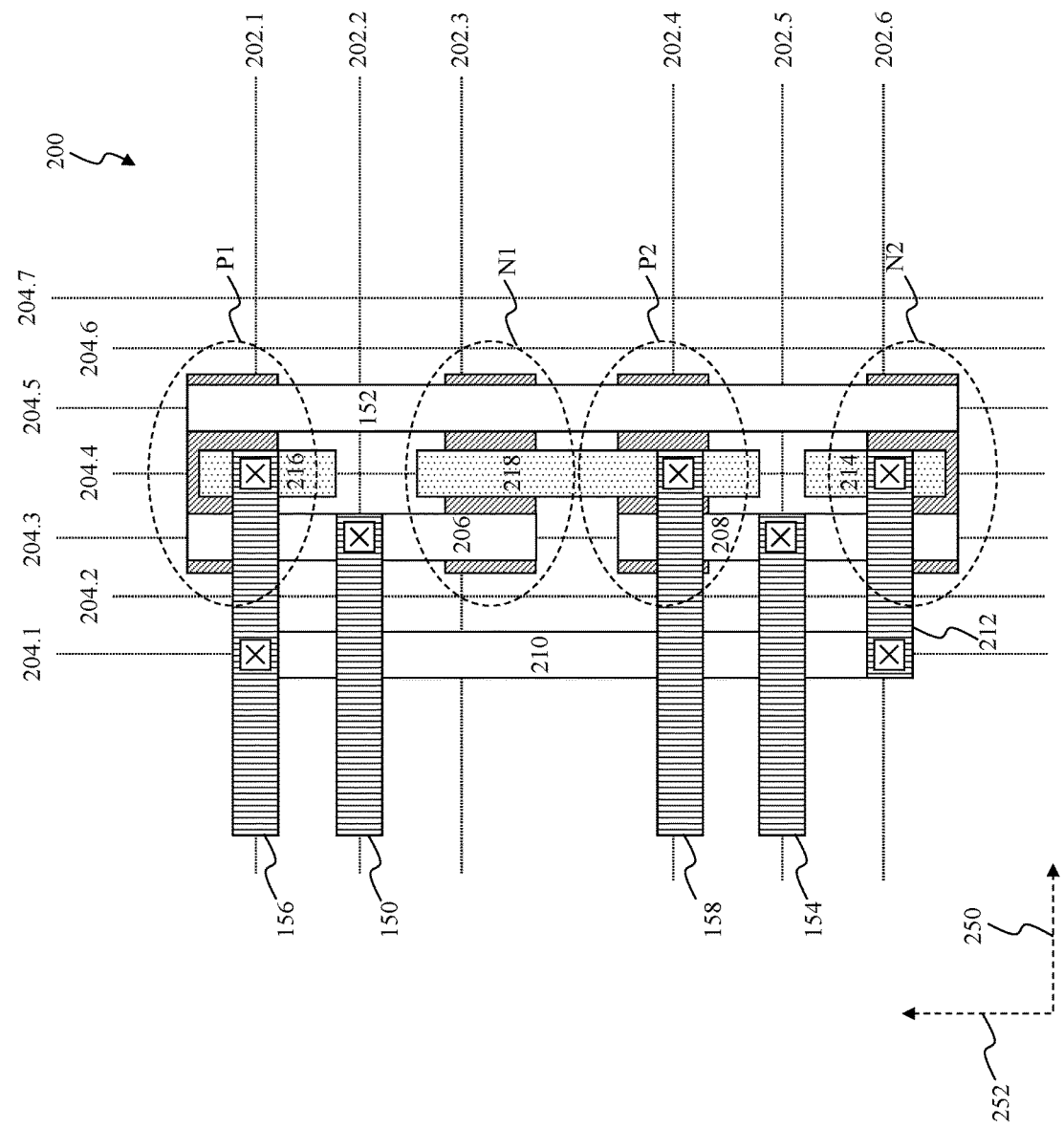
FIG. 2 through FIG. 32 illustrate various exemplary integrated circuit layouts for the exemplary dual transmission gate according to exemplary embodiments of the present disclosure.

As illustrated in FIG. 2, the exemplary integrated circuit layout 200 includes the first metal layer having one or more regions of one or more conductive materials such as tungsten (W), aluminum (Al), copper (Cu), gold (Au), silver (Ag), or platinum (Pt) to provide some examples, situated within the multiple rows 202.1 through 202.6 along the first direction 250. In the exemplary embodiment illustrated in FIG. 2, the one or more regions of the conductive material situated within the first metal layer are illustrated using a vertical shading. Moreover, the multiple rows 202.1 through 202.6 include various oxide diffusion (OD) regions, illustrated using a diagonal shading, situated within the multiple rows 202.1 through 202.6 along the first direction 250 for forming active layers of various transistors of the dual transmission gate, such as the PMOS transistor P1, the PMOS transistor P2, the NMOS transistor N1, and/or the NMOS transistor N2 as described in FIG. 1.

As additionally illustrated in FIG. 2, the exemplary integrated circuit layout 200 includes the MD layer having one or more regions of one or more conductive materials such as tungsten (W), aluminum (Al), copper (Cu), gold (Au), silver (Ag), or platinum (Pt) to provide some examples, situated within the multiple columns 204.1 through 204.7 along the second direction 252. In the exemplary embodiment illustrated in FIG. 2, the one or more regions of the conductive material situated within the MD layer are illustrated using a solid white shading. Moreover, the exemplary integrated circuit layout 200 includes the polysilicon layer having one or more regions of a polysilicon material, illustrated using a dotted shading, situated within the multiple columns 204.1 through 204.7 along the second direction 252. In the exemplary embodiment illustrated in FIG. 2, the exemplary integrated circuit layout 200 further includes various via structures, illustrated as a squared "x" in FIG. 2, to form interconnections between the multiple rows 202.1 through 202.6 and the multiple columns 204.1 through 204.7. In an exemplary embodiment, the various via structures described herein can represent through hole via structures, blind via structures, buried via structures, or any other suitable via structures that will be apparent to those skilled in the relevant art(s) without departing from the spirit and scope of the present disclosure.

In the exemplary embodiment illustrated in FIG. 2, a first region of the one or more conductive materials situated within the first metal layer extending along the row 202.2 in the first direction 250 represents the first terminal 150 as described in FIG. 1. As illustrated in FIG. 2, the first terminal 150 is electrically connected to a conductive region 206 of the one or more conductive materials situated within the MD layer extending along the column 204.3 in the second direction 252 using a via structure. The conductive region 206 is electrically connected to a first OD region corresponding to the PMOS transistor P1 and a second OD region corresponding to the NMOS transistor N1 extending along the row 202.1 in the first direction 250 to form a source/drain region of the PMOS transistor P1 and along the row 202.3 to form a source/drain region of the NMOS transistor N1, respectively.

In the exemplary embodiment illustrated in FIG. 2, a second region of the one or more conductive materials situated within the first metal layer extending along the row 202.5 in the first direction 250 represents the third terminal 154 as described in FIG. 1. As illustrated in FIG. 2, the third terminal 154 is electrically connected to a conductive region 208 of the one or more conductive materials situated within the MD layer extending along the column 204.3 in the second direction 252 using a via structure. The conductive region 208 is electrically connected to a third OD region corresponding to the PMOS transistor P2 and a fourth OD region corresponding to the NMOS transistor N2 extending along the row 202.4 in the first direction 250 to form a source/drain region of the PMOS transistor P2 and along the row 202.6 to form a source/drain region of the NMOS transistor N2, respectively.

In the exemplary embodiment illustrated in FIG. 2, a third region of the one or more conductive materials situated within the first metal layer extending along the row 202.1 in the first direction 250 represents the first clocking signal 156 as described in FIG. 1. As illustrated in FIG. 2, the first clocking signal 156 is electrically connected to a conductive region 210 of the one or more conductive materials situated within the MD layer extending along the column 204.1 in the second direction 252 using a via structure. The conductive region 210 is electrically connected to a conductive region 212 of the one or more conductive materials situated within the first metal layer extending along the row 202.6 in the first direction 250. The conductive region 212 is electrically connected to a polysilicon region 214 of the polysilicon material situated within the one or more polysilicon layers extending along the column 204.4 in the second direction 252 using a via structure. The polysilicon region 214 overlaps the fourth OD region corresponding to the NMOS transistor N2 to form a gate region of the NMOS transistor N2. As additionally illustrated in FIG. 2, the first clocking signal 156 is electrically connected to a polysilicon region 216 of the polysilicon material situated within the one or more polysilicon layers extending along the column 204.4 in the second direction 252 using a via structure. The polysilicon region 216 overlaps the first OD region corresponding to the PMOS transistor P1 to form a gate region of the PMOS transistor P1.

Referring back to FIG. 2, a fourth region of the one or more conductive materials situated within the first metal layer extending along the row 202.4 in the first direction 250 represents the second clocking signal 158 as described in FIG. 1. As illustrated in FIG. 2, the second clocking signal 158 is electrically connected to a polysilicon region 218 of the polysilicon material situated within the one or more polysilicon layers extending along the column 204.4 in the second direction 252 using a via structure. The polysilicon region 218 overlaps the second OD region corresponding to the NMOS transistor N1 to form a gate region of the NMOS transistor N1 and the third OD region corresponding to the PMOS transistor P2 to form a gate region of the PMOS transistor P2.

In the exemplary embodiment illustrated in FIG. 2, a fourth region of the one or more conductive materials situated within the MD layer extending along the column 204.5 in the second direction 252 represents the second terminal 152 as described in FIG. 1. The second terminal 152 is electrically connected to the first OD region corresponding to the PMOS transistor P1, the second OD region corresponding to the NMOS transistor N1, the third OD region corresponding to the PMOS transistor P2, and the fourth OD region corresponding to the NMOS transistor N2 to form a source/drain region of the PMOS transistor P1, a source/drain region of the NMOS transistor N1, a source/drain region of the PMOS transistor P2, and a source/drain region of the NMOS transistor N2, respectively.

Alternative Exemplary Integrated Circuit Layouts for the Exemplary Dual Transmission Gate The discussion of FIG. 3 through FIG. 32 of the exemplary integrated circuit layout 300 through exemplary integrated circuit layout 3200, respectively, to follow briefly outlines differences between these exemplary integrated circuit layouts and the exemplary integrated circuit layout 200. Although not described in further detail, the exemplary integrated circuit layout 300 through exemplary integrated circuit layout 3200 can include different configurations and arrangements for the first terminal 150, the second terminal 152, the third terminal 154, the first clocking signal 156, and/or the second clocking signal 158 than as illustrated in FIG. 2. Those skilled in the relevant art(s) will readily recognize these different configurations and arrangements for the first terminal 150, the second terminal 152, the third terminal 154, the first clocking signal 156, and/or the second clocking signal 158 from FIG. 3 through FIG. 32 without departing from the spirit and scope of the present disclosure. For convenience, the first terminal 150, the second terminal 152, the third terminal 154, the first clocking signal 156, the second clocking signal 158, the PMOS transistor P1, the NMOS transistor N1, the PMOS transistor P2, and the NMOS transistor N2 are illustrated in FIG. 3 through FIG. 32. As illustrated in FIG. 3 through FIG. 32, the first terminal 150 electrically connects a source/drain region of the NMOS transistor N1 and a source/drain region of the PMOS transistor P1 as illustrated in FIG. 1. The second terminal 152 electrically connects a source/drain region of the NMOS transistor N1, a source/drain region of the PMOS transistor P1, a source/drain region of the PMOS transistor P2, and a source/drain region of the NMOS transistor P2 as illustrated in FIG. 1. The third terminal 154 electrically connects a source/drain region of the NMOS transistor N2 and a source/drain region of the PMOS transistor P2 as illustrated in FIG. 1. The first clocking signal 156 electrically connects a gate region of the PMOS transistor P1 and a gate region of the NMOS transistor N2. The second clocking signal 158 electrically connects a gate region of the NMOS transistor N1 and a gate region of the PMOS transistor P2

The exemplary integrated circuit layout 300 through exemplary integrated circuit layout 3200 of the exemplary dual transmission gate similarly include various geometric shapes that are situated within an oxide diffusion (OD) layer, a polysilicon layer, a metal diffusion (MD) layer, a first metal layer, and/or a second metal layer. These geometric shapes of the exemplary integrated circuit layout 300 through exemplary integrated circuit layout 3200 can be situated within an electronic device design real estate in a substantially similar manner as the exemplary integrated circuit layout 200 as described above in FIG. 2. In the exemplary integrated circuit layout 300 through exemplary integrated circuit layout 3200, the OD layer and/or one the first metal layer of the semiconductor stack are situated along the multiple rows in the first direction 250. In exemplary integrated circuit layout 300 through exemplary integrated circuit layout 3200, the one or more polysilicon layers, the MD layer and/or the second metal layer of the semiconductor stack are situated along the multiple columns in the second direction 252.

Figure 3:
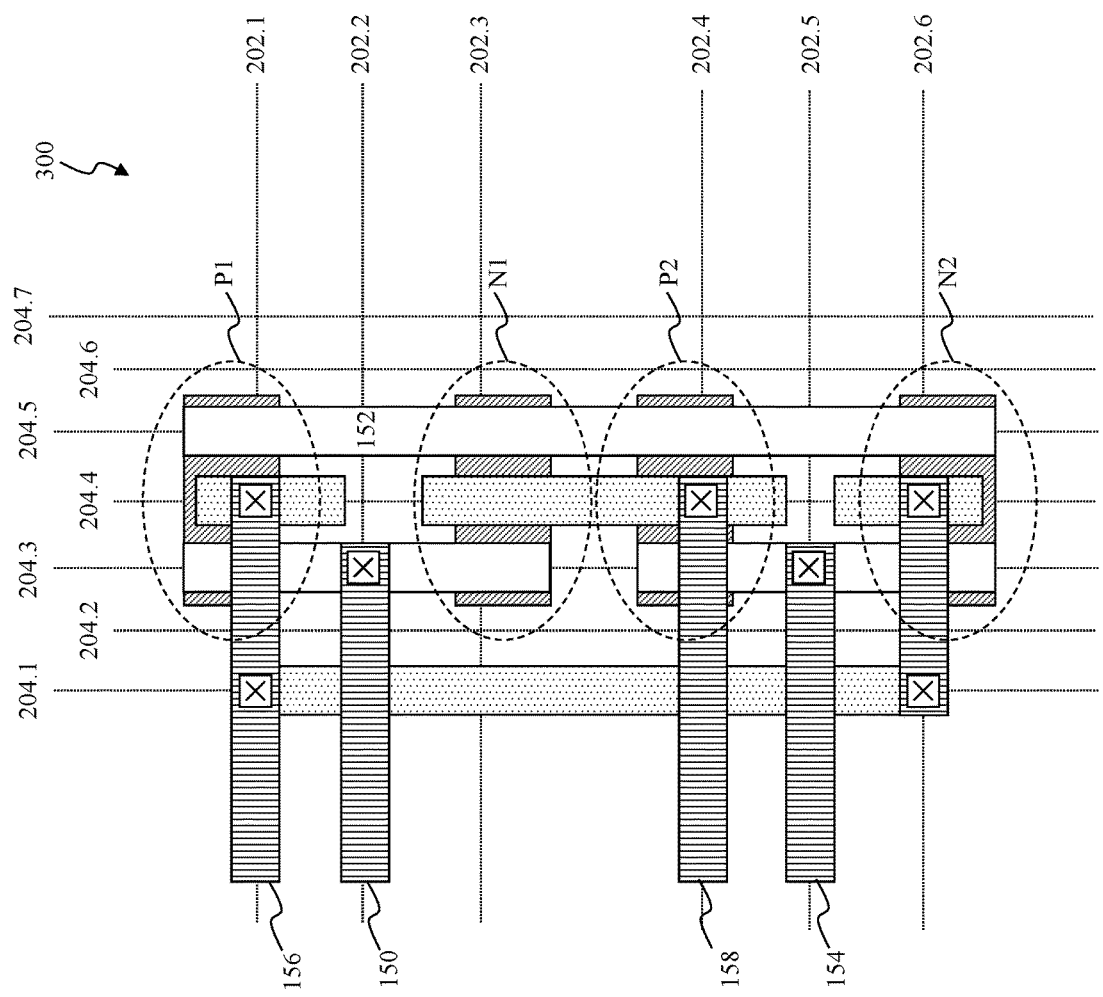
Figure 4:
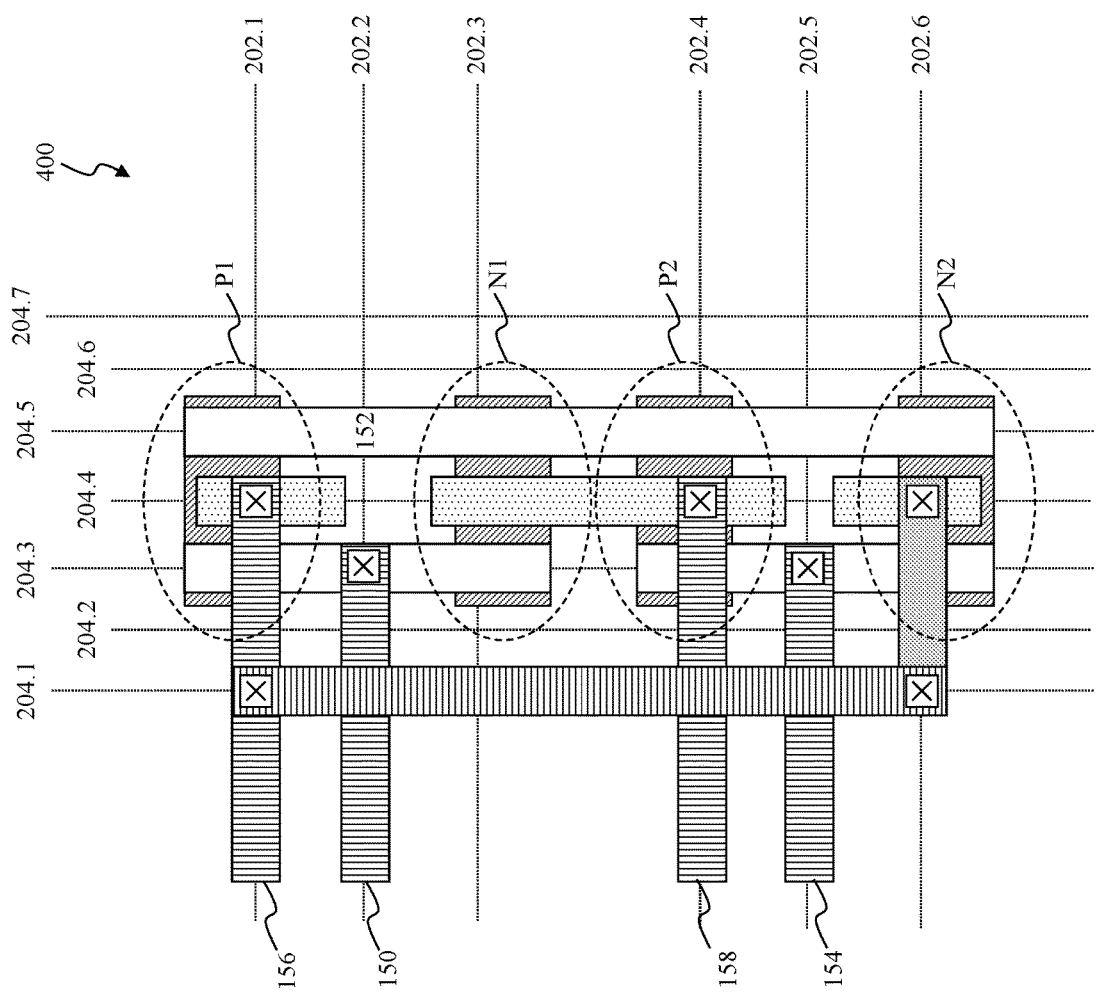

The exemplary integrated circuit layout 300 as illustrated in FIG. 3 and the exemplary integrated circuit layout 400 as illustrated in FIG. 4 include alternative connections between the first clocking signal 156 and the conductive region 212 as illustrated in FIG. 2. In the exemplary embodiment illustrated in FIG. 3, this alternative connection can be implemented using the polysilicon material situated within the one or more polysilicon layers. Alternately, in the exemplary embodiment illustrated in FIG. 4, this alternative connection can be implemented using the one or more conductive materials situated within the second metal layer.

Figure 5:
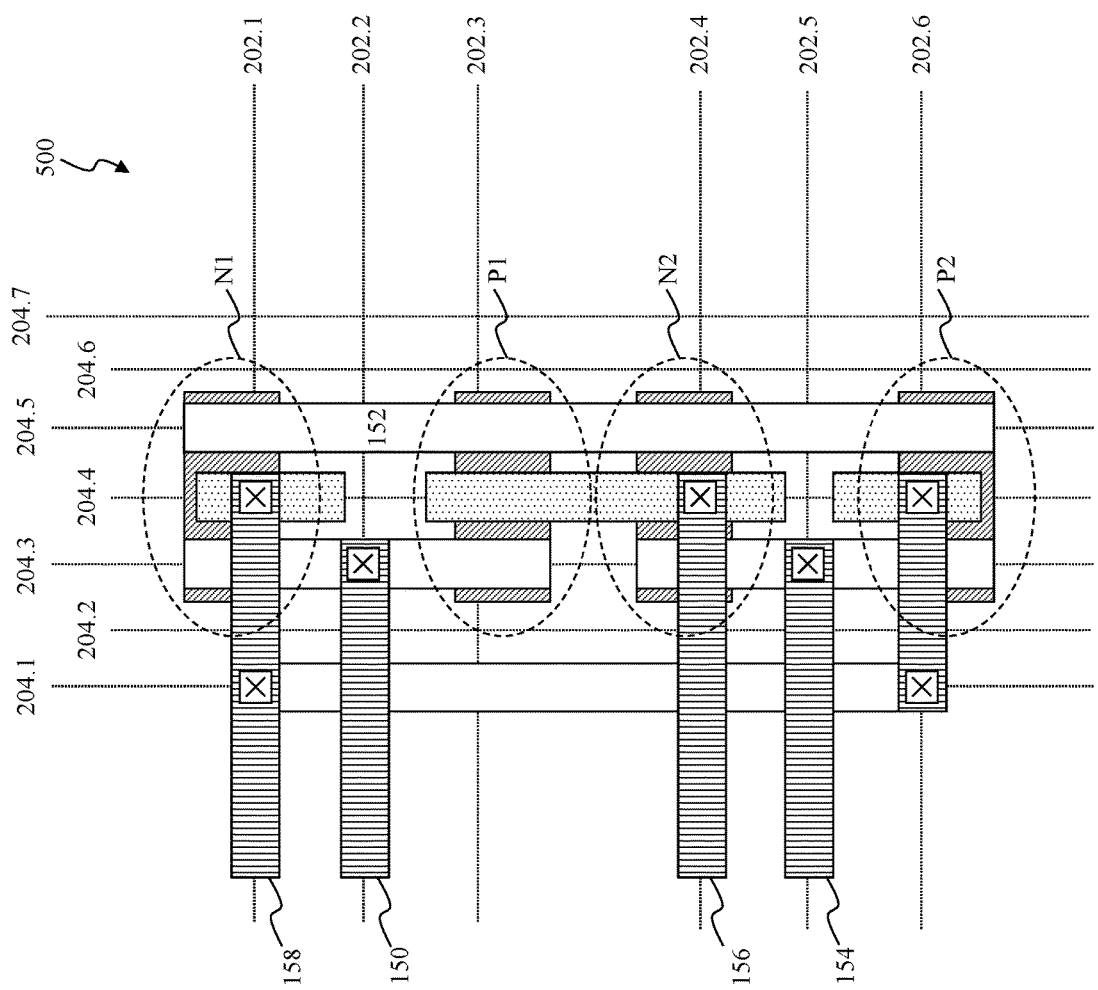
Figure 6:
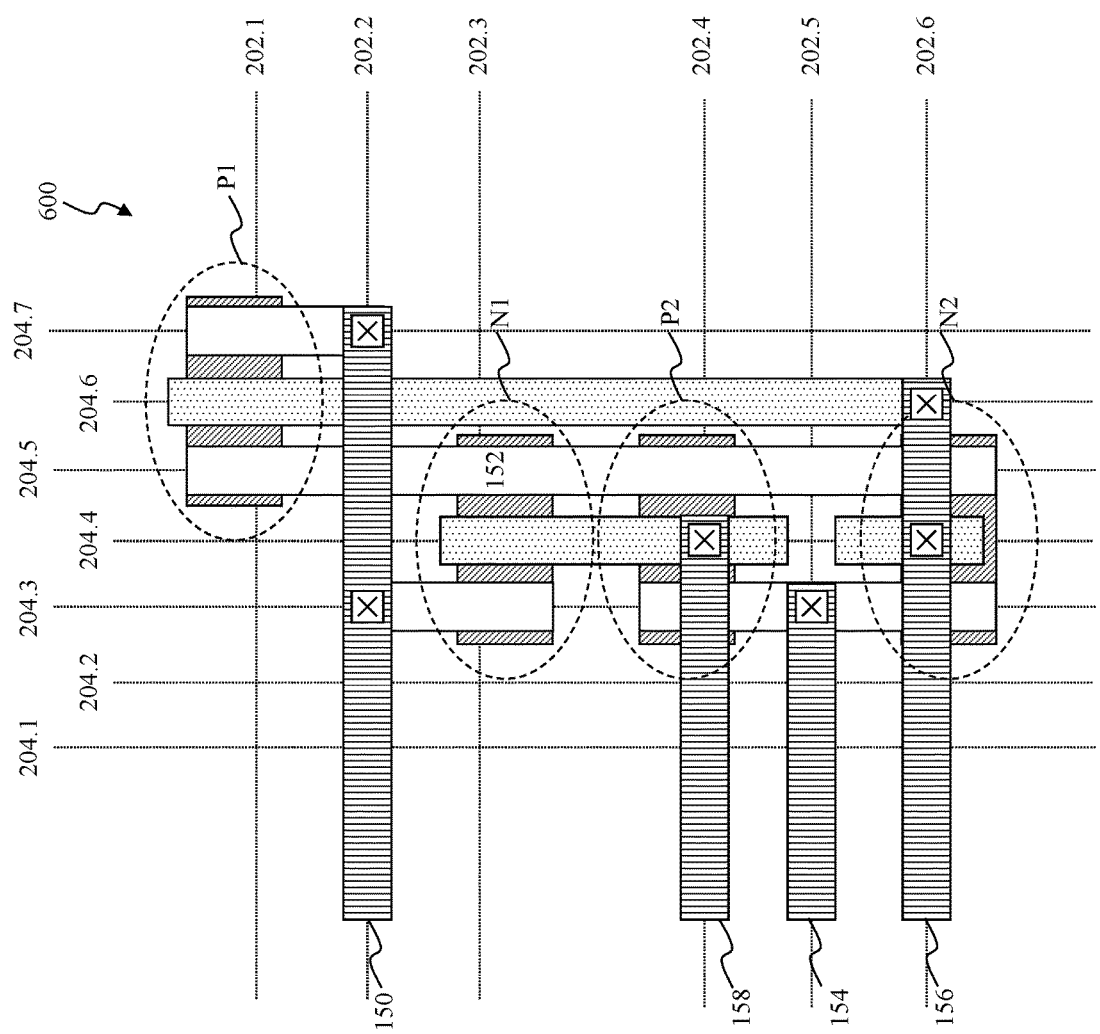
Figure 7:
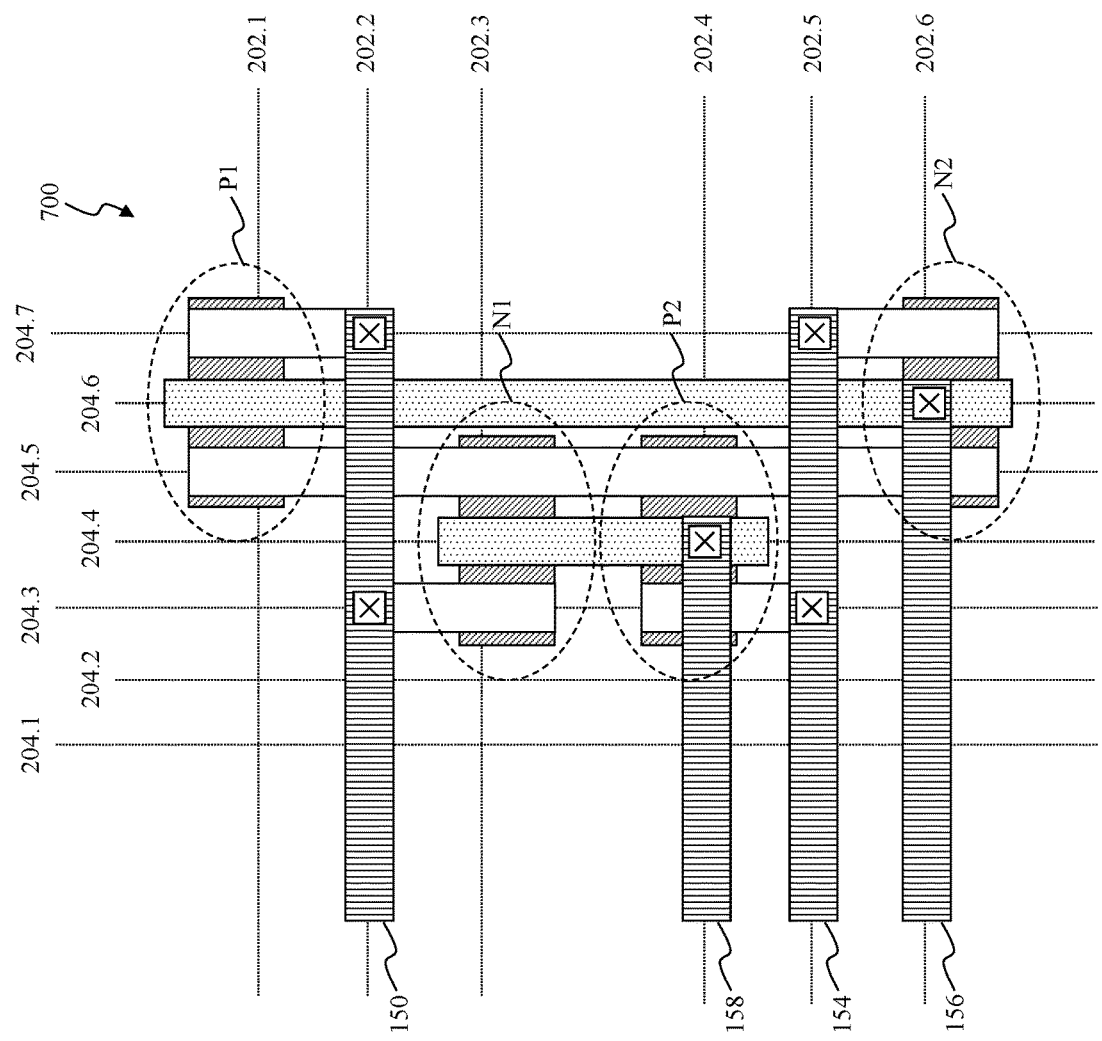
Figure 8:
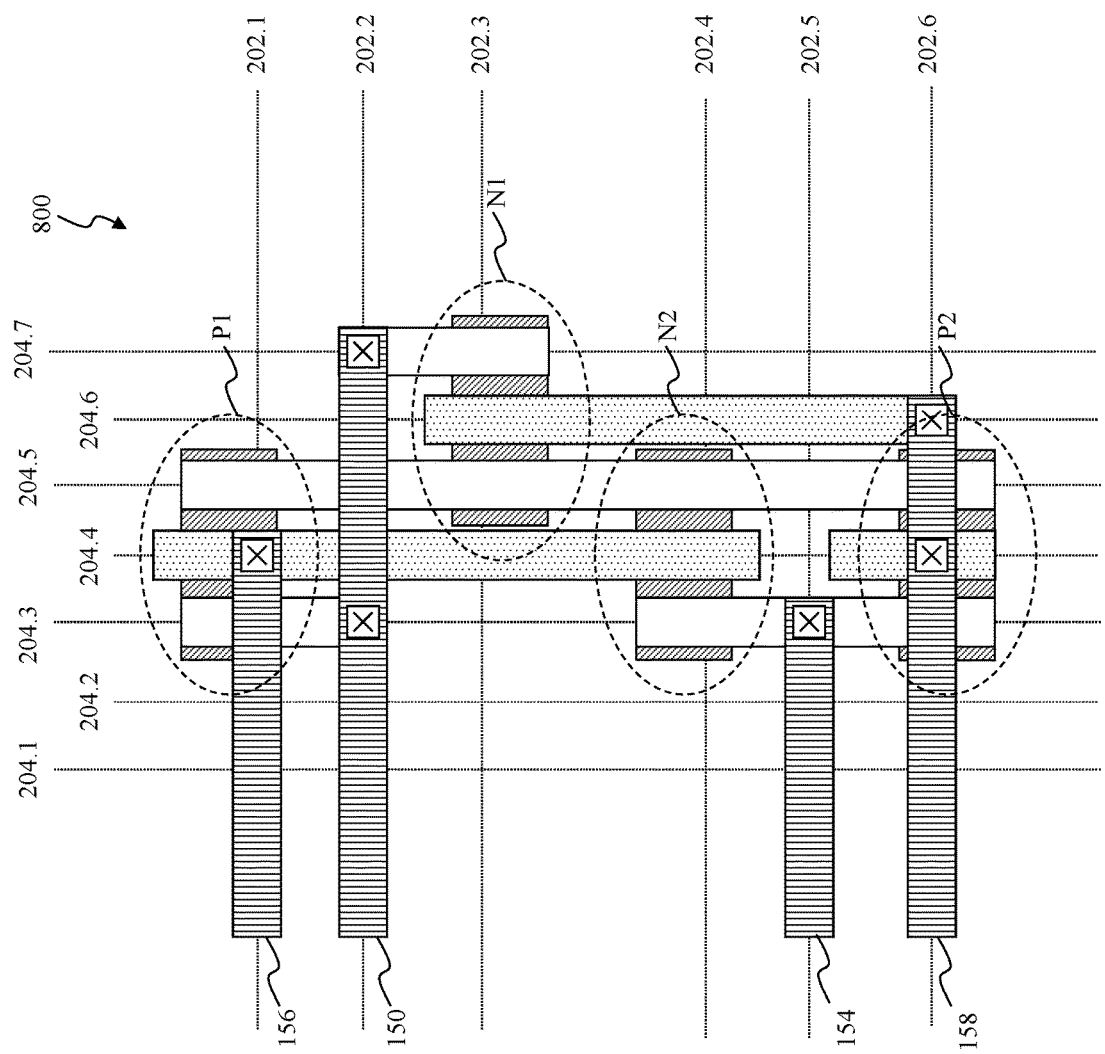
Figure 9:
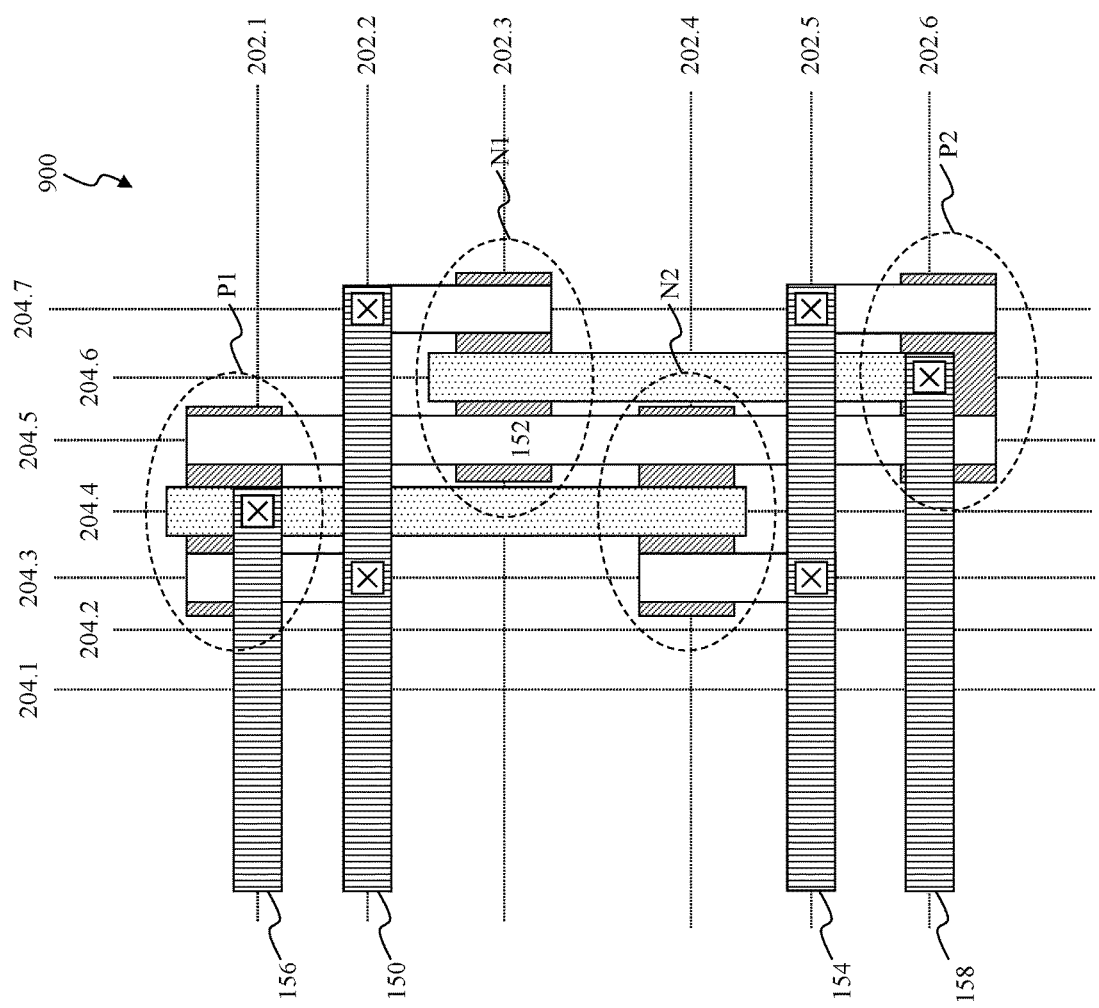
Figure 10:
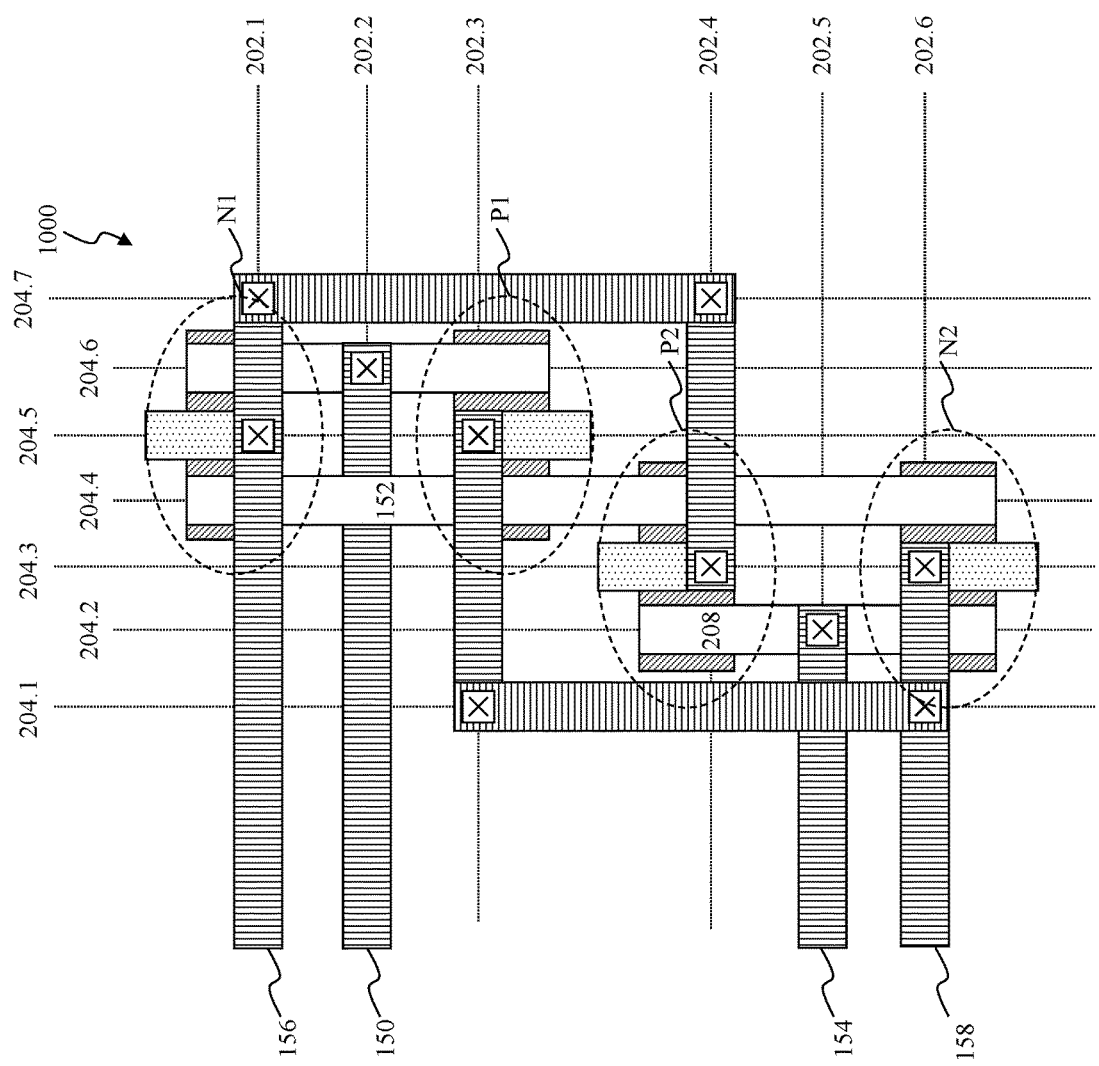
Figure 11:
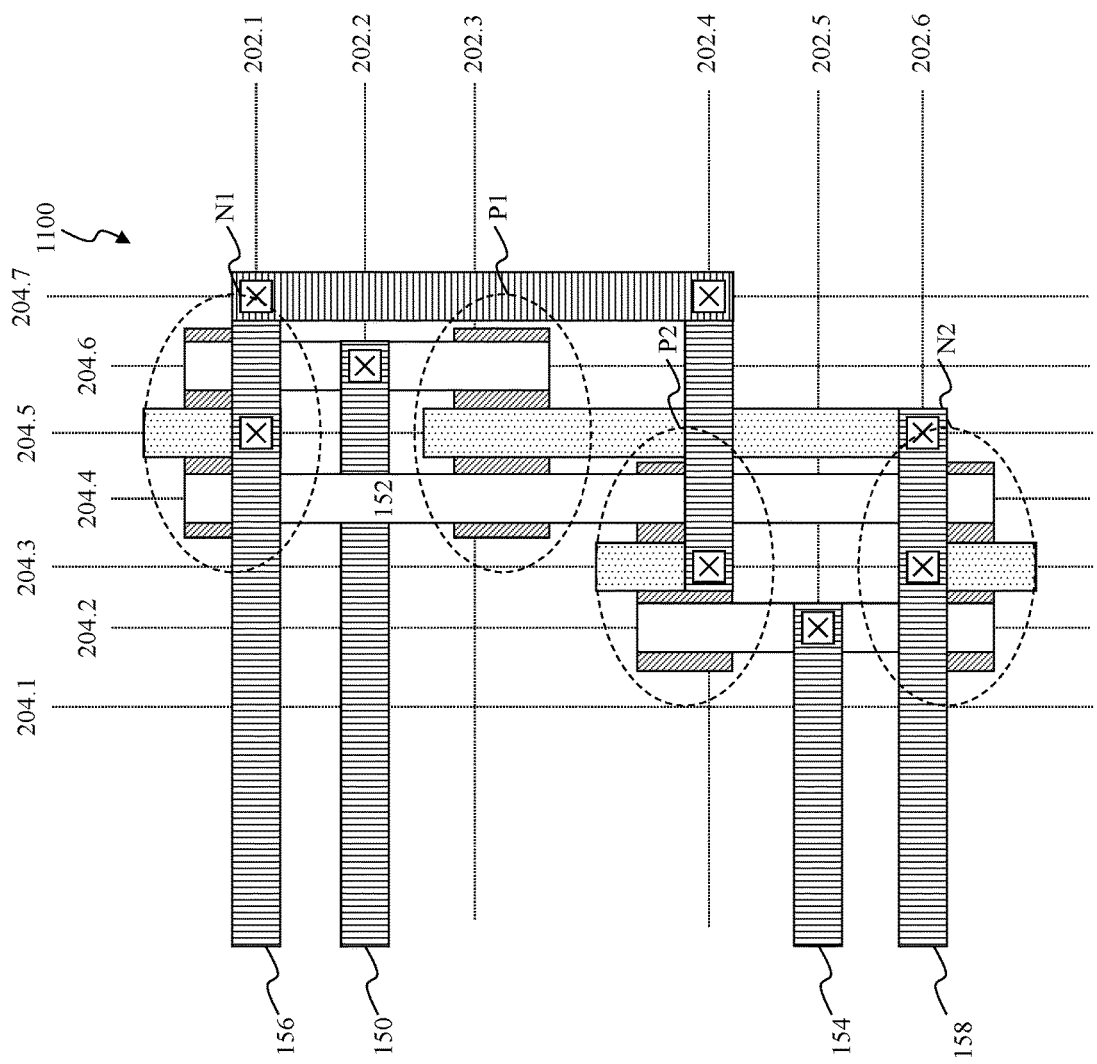
Figure 12:
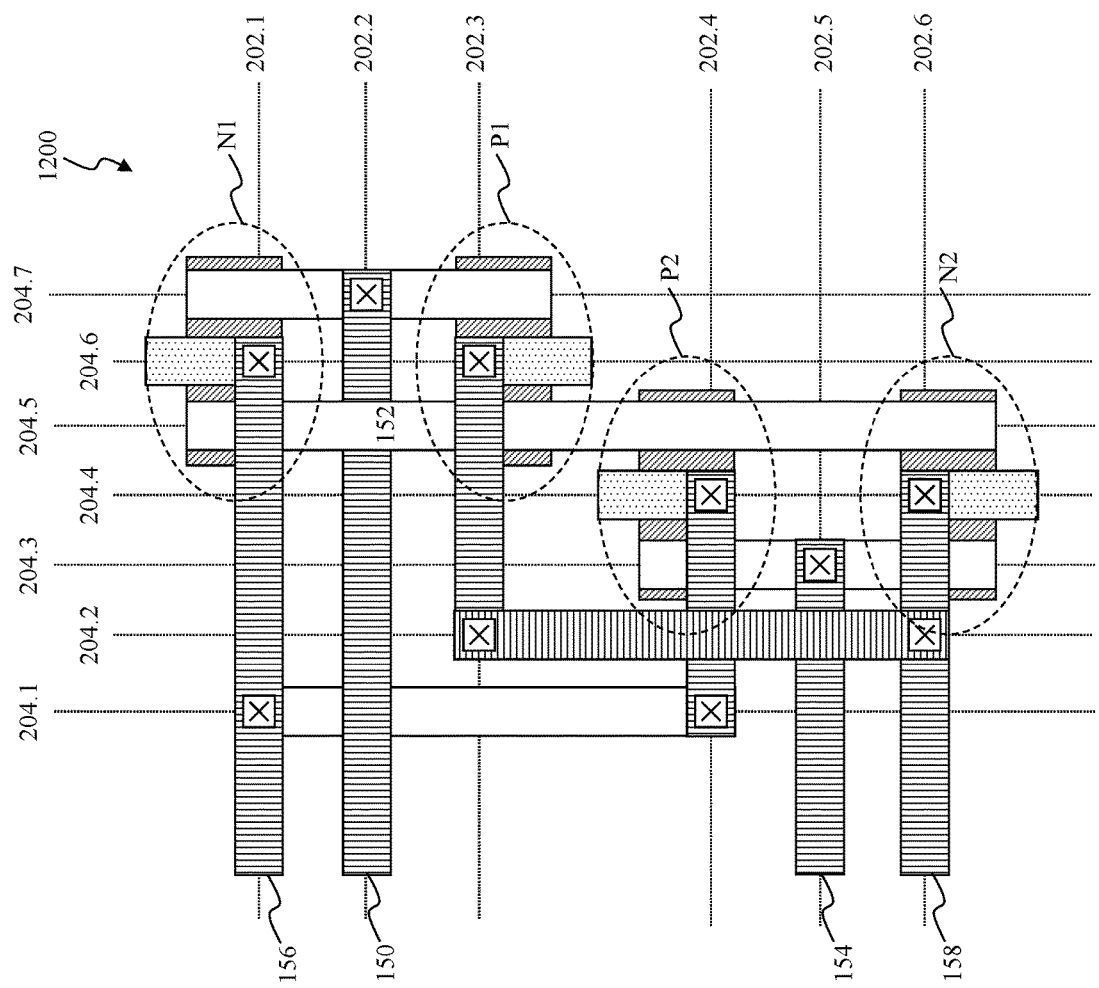
Figure 13:
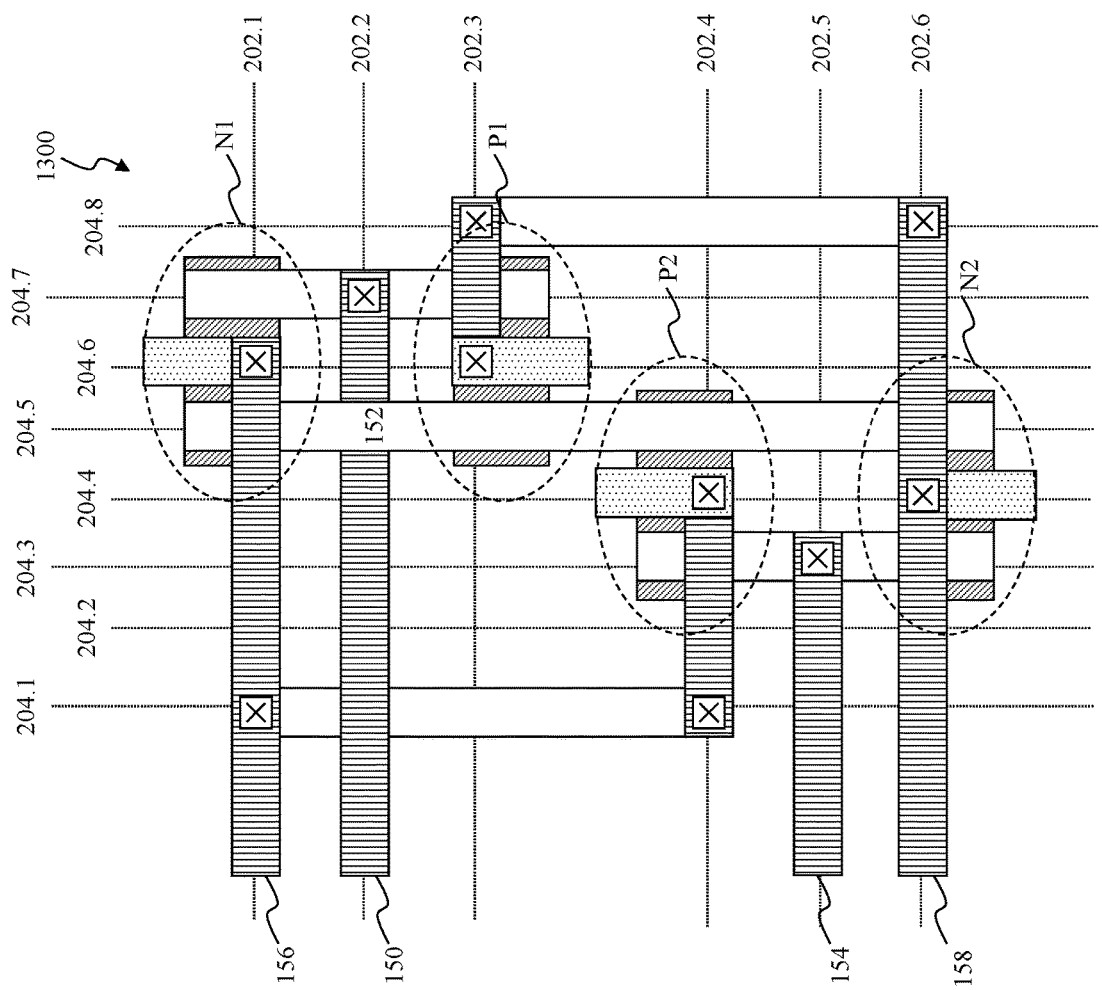
Figure 14:
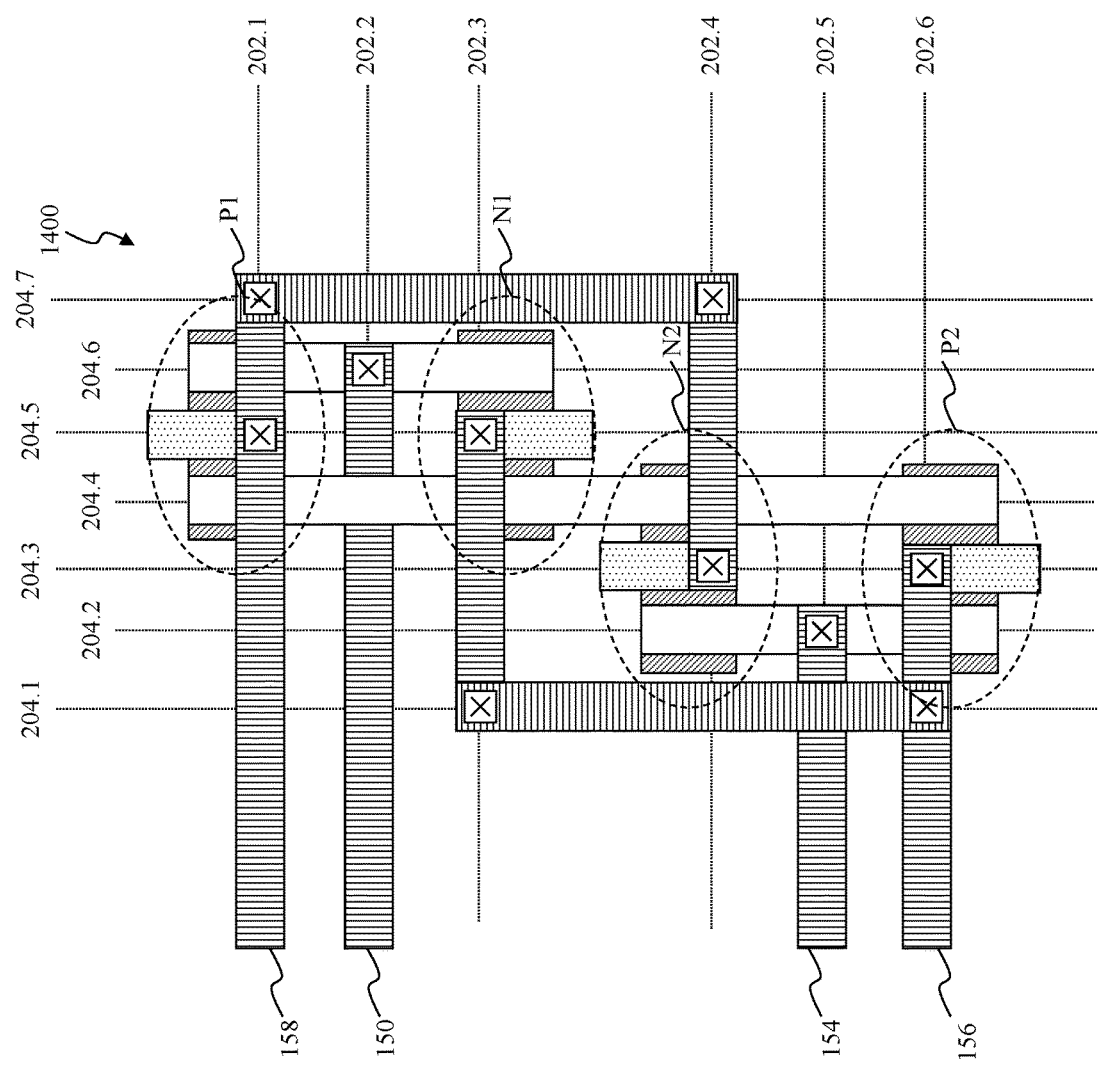
Figure 15:
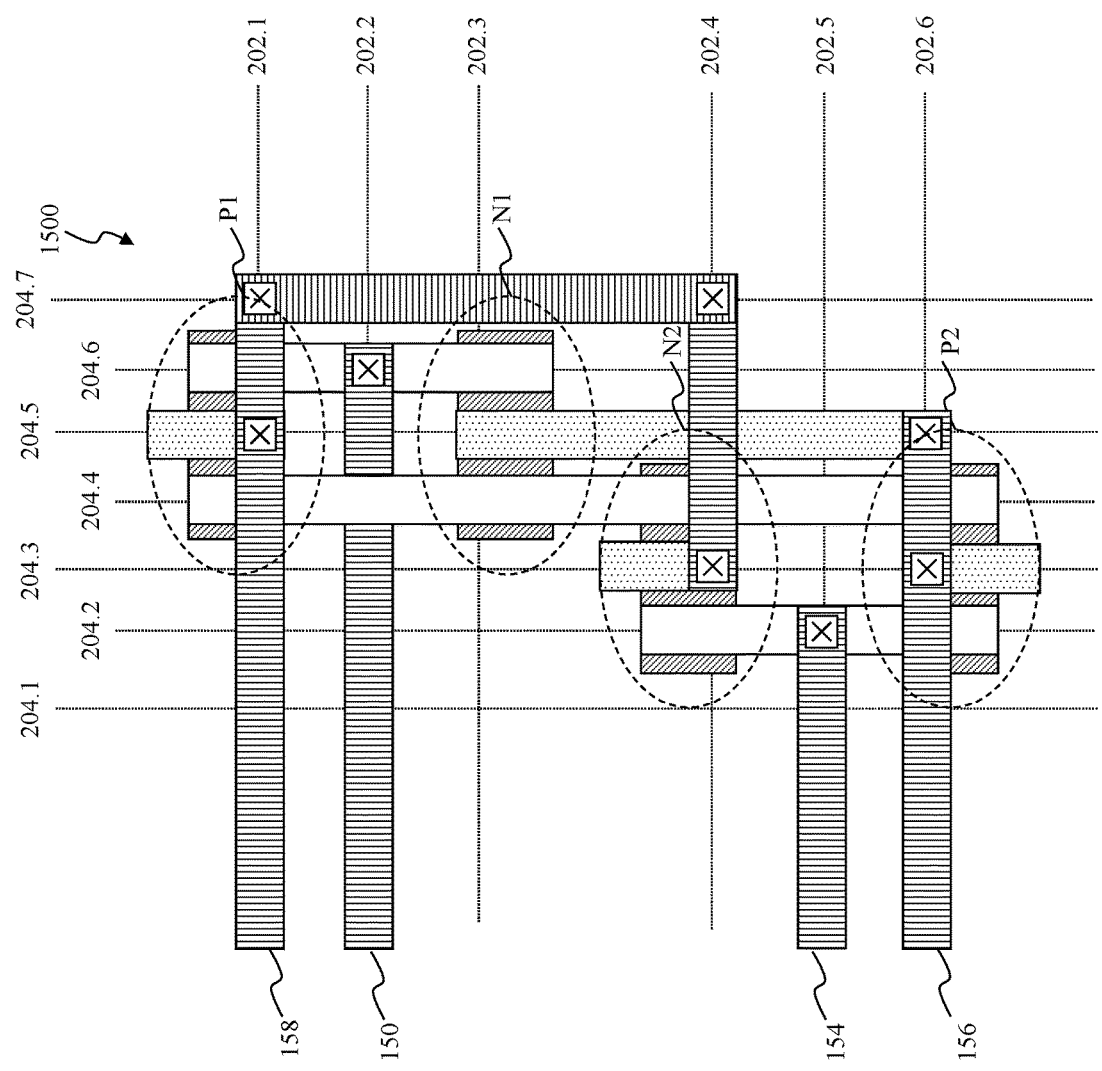
Figure 16:
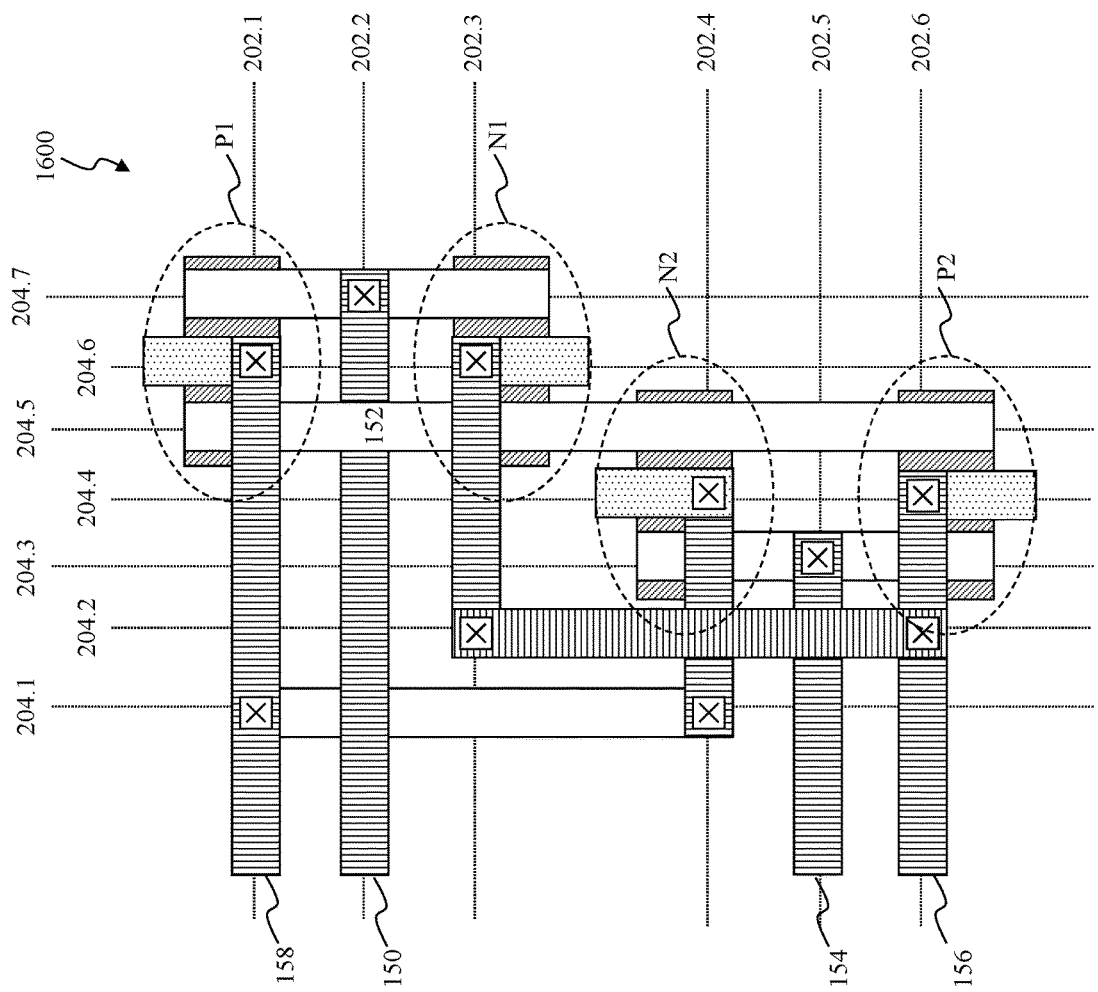
Figure 17:
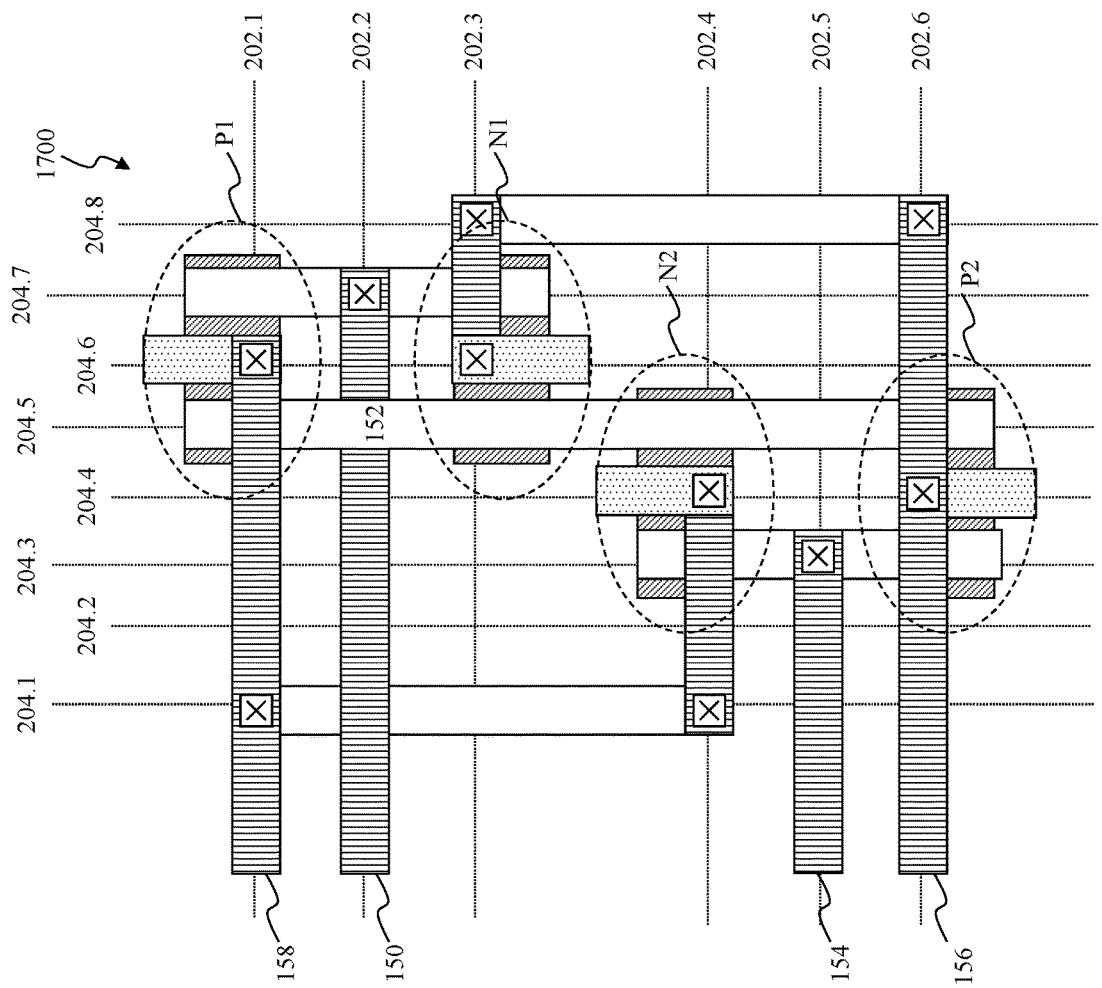
Figure 18:
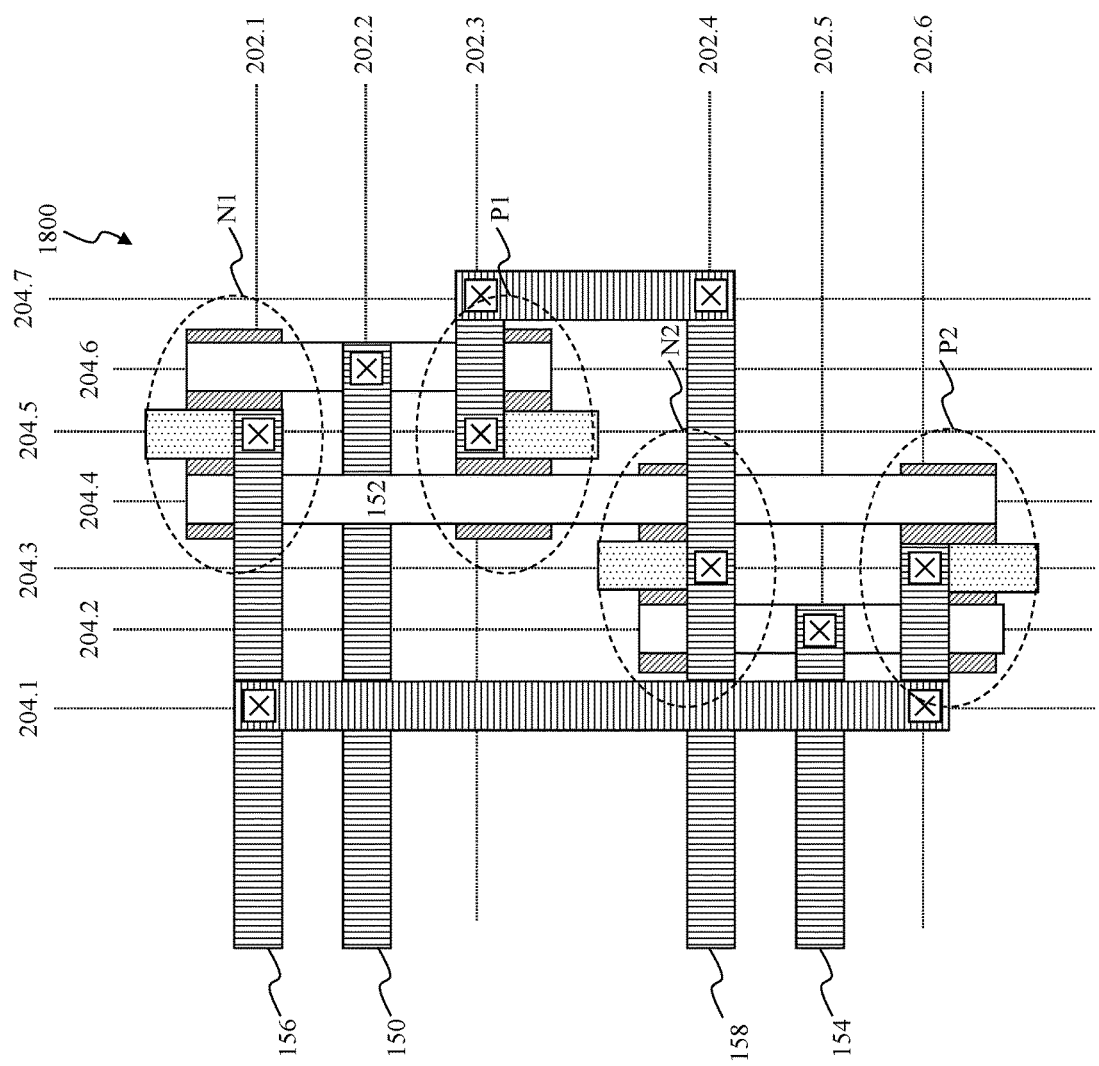
Figure 19:
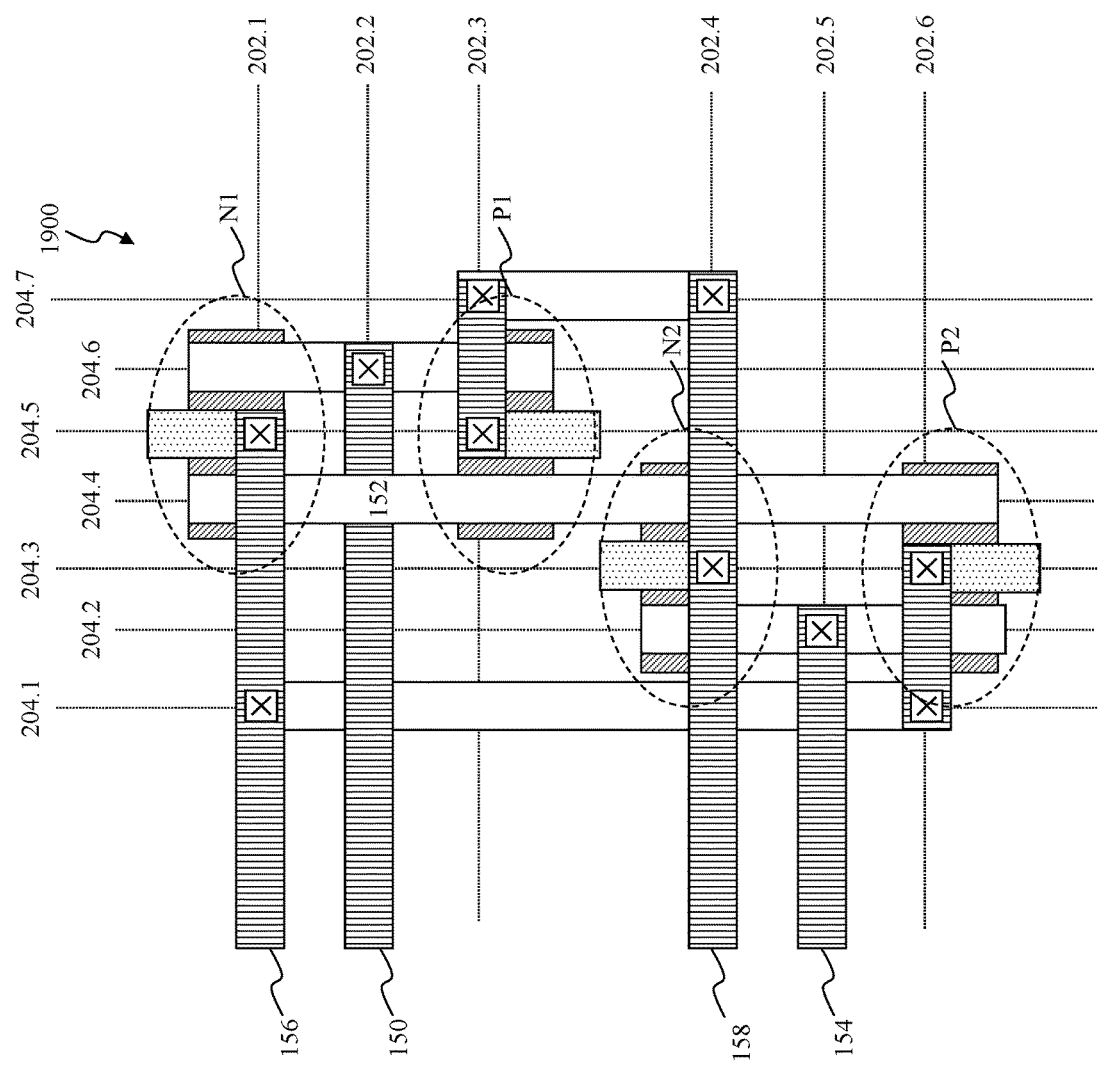
Figure 20:
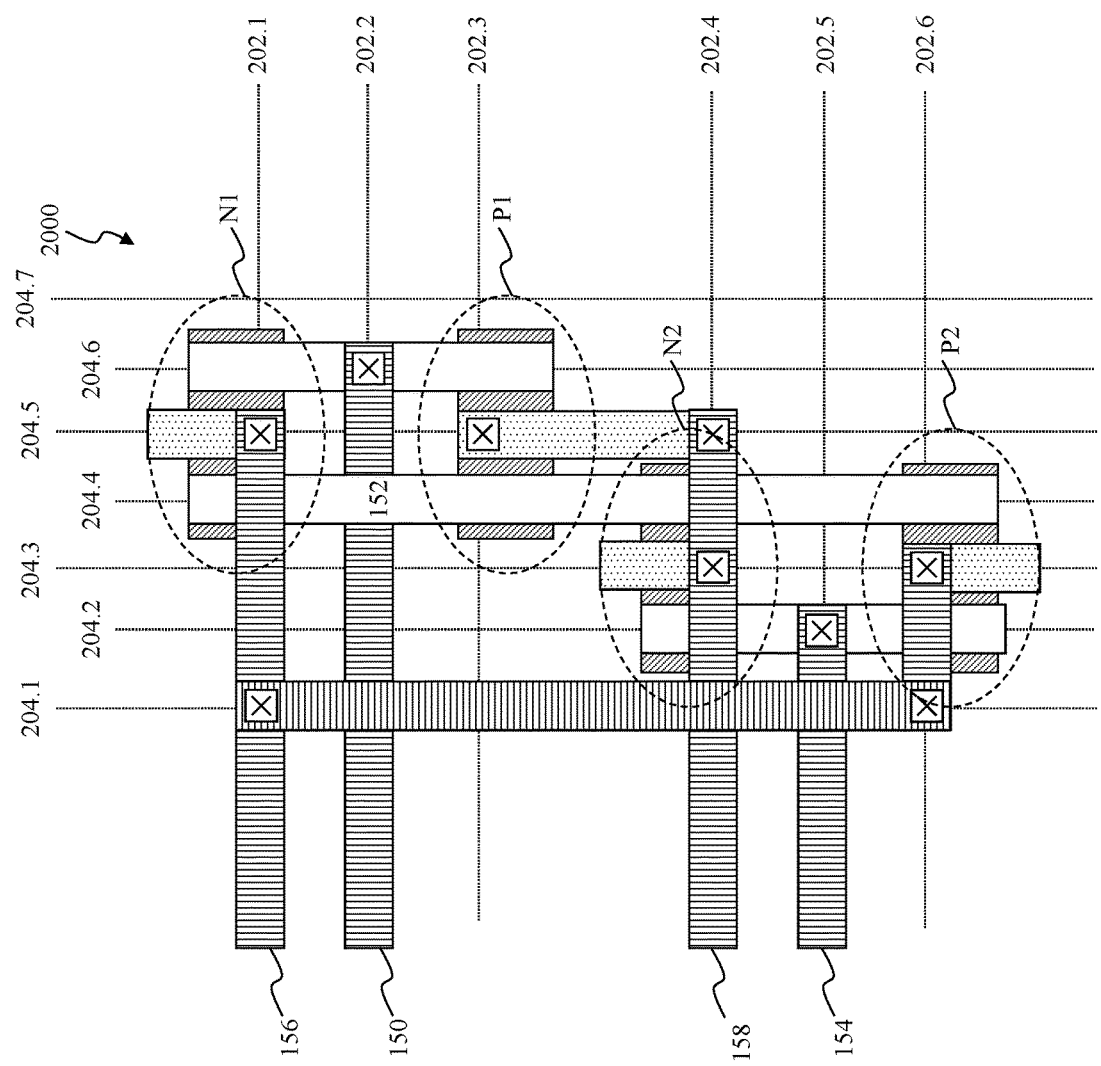
Figure 21:
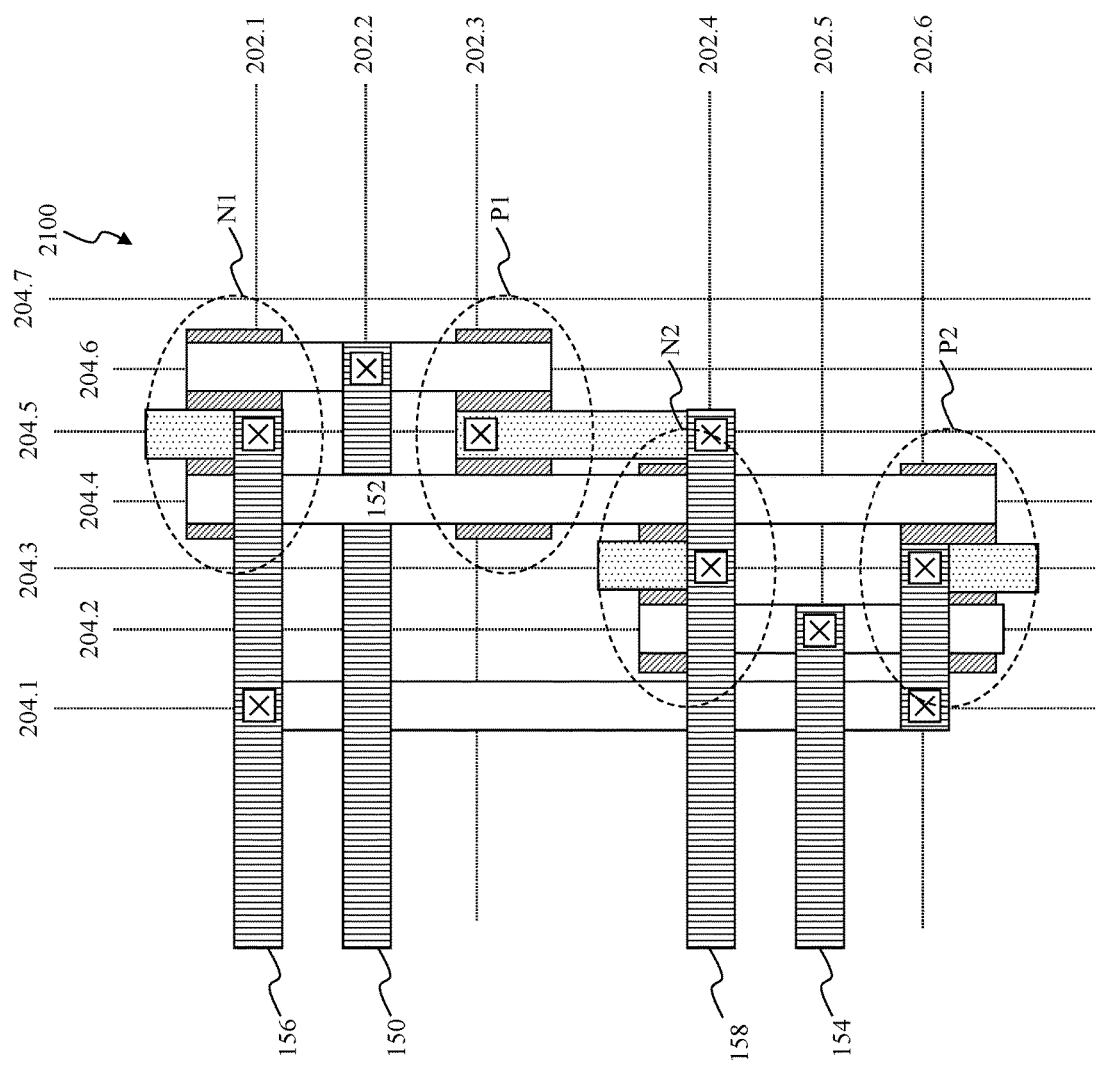
Figure 22:
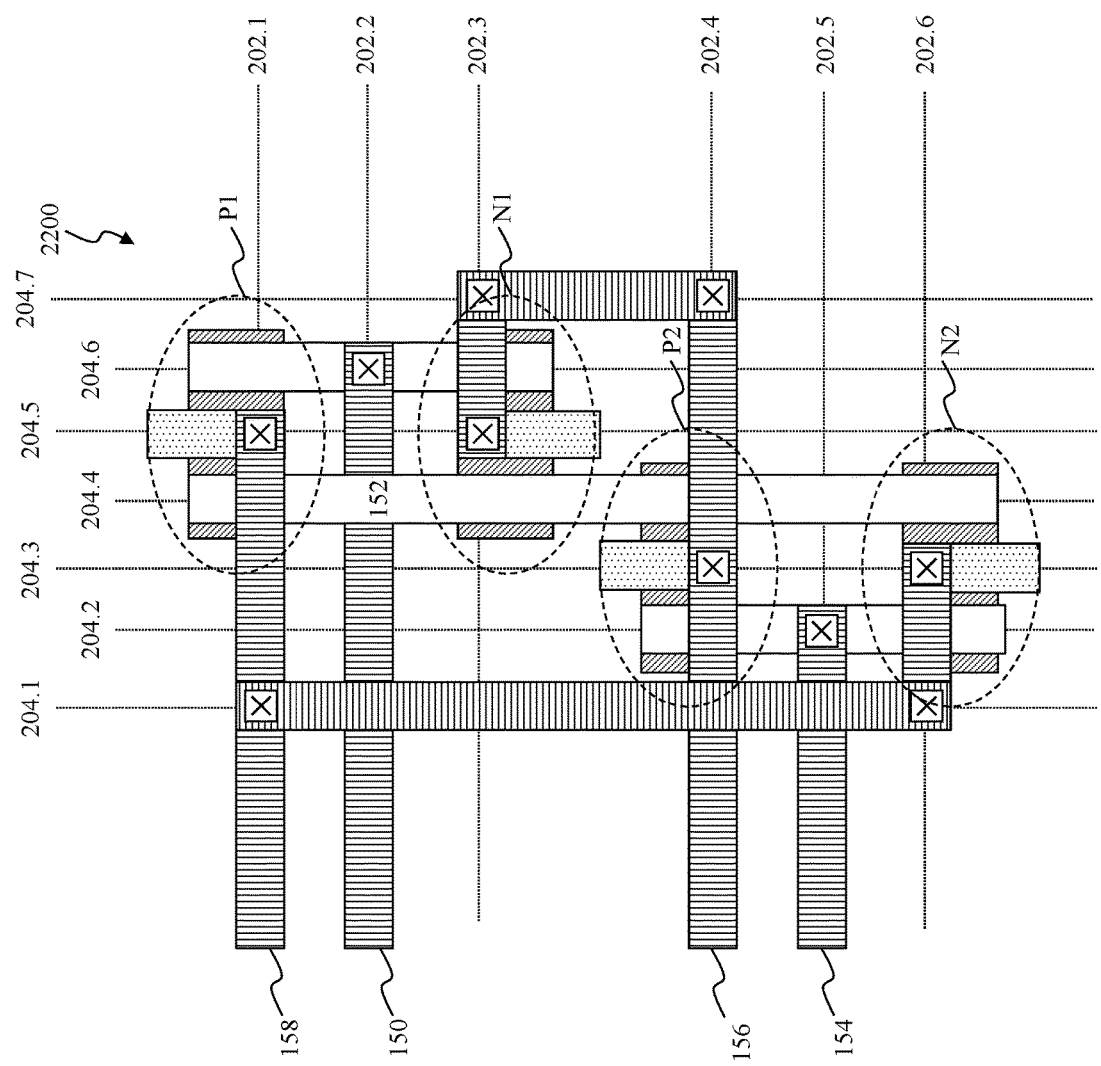
Figure 23:
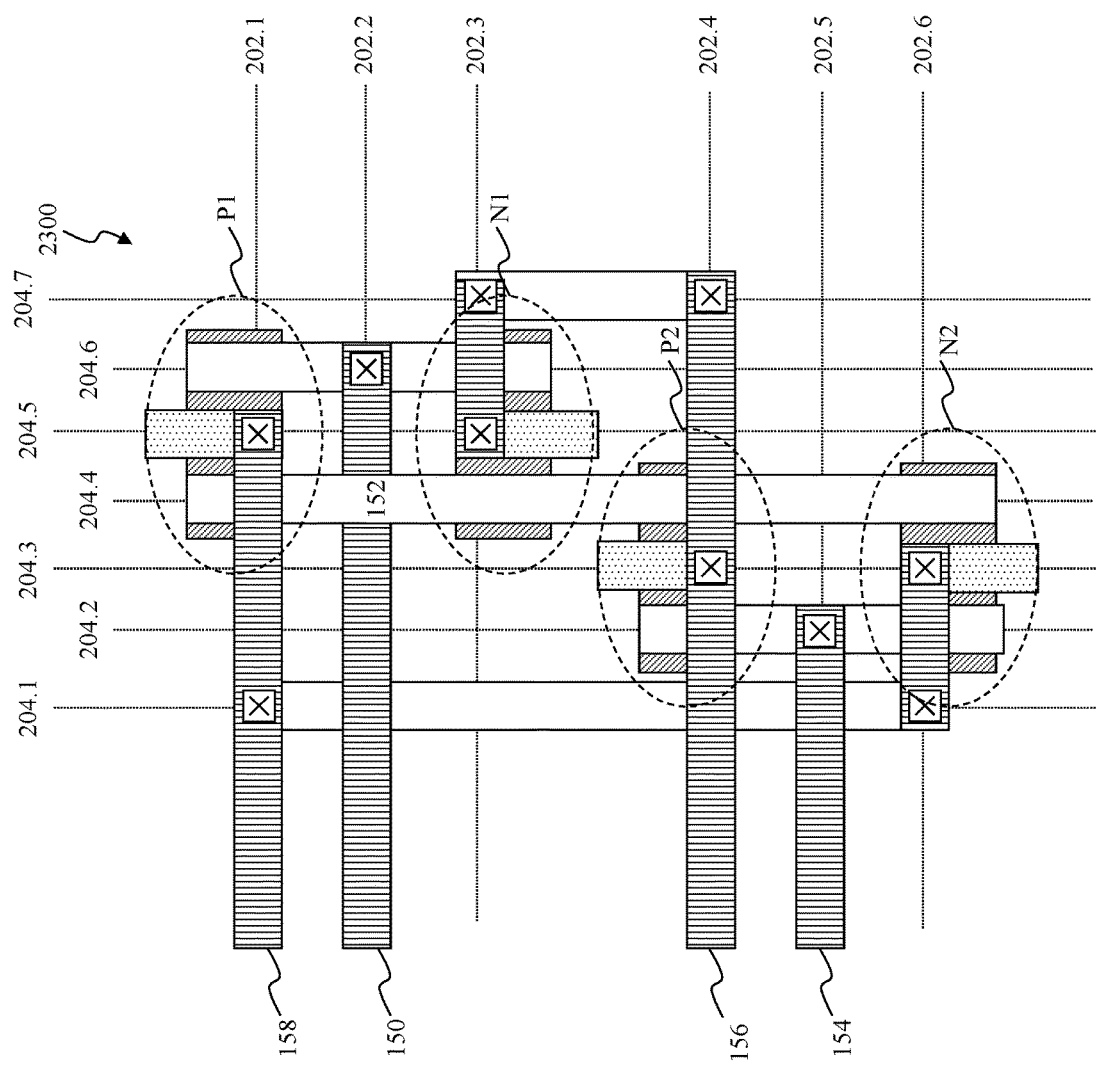
Figure 24:
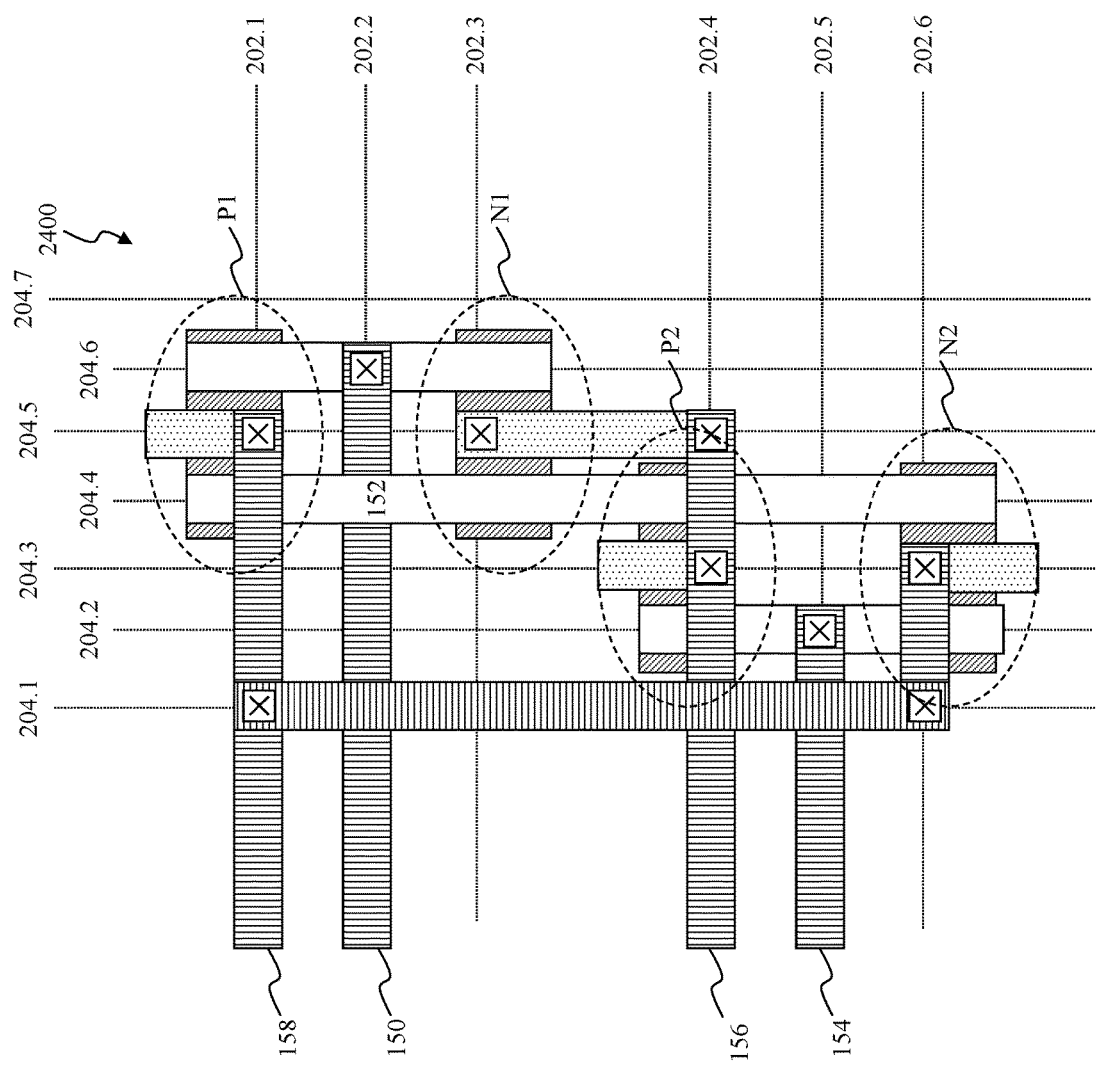
Figure 25:
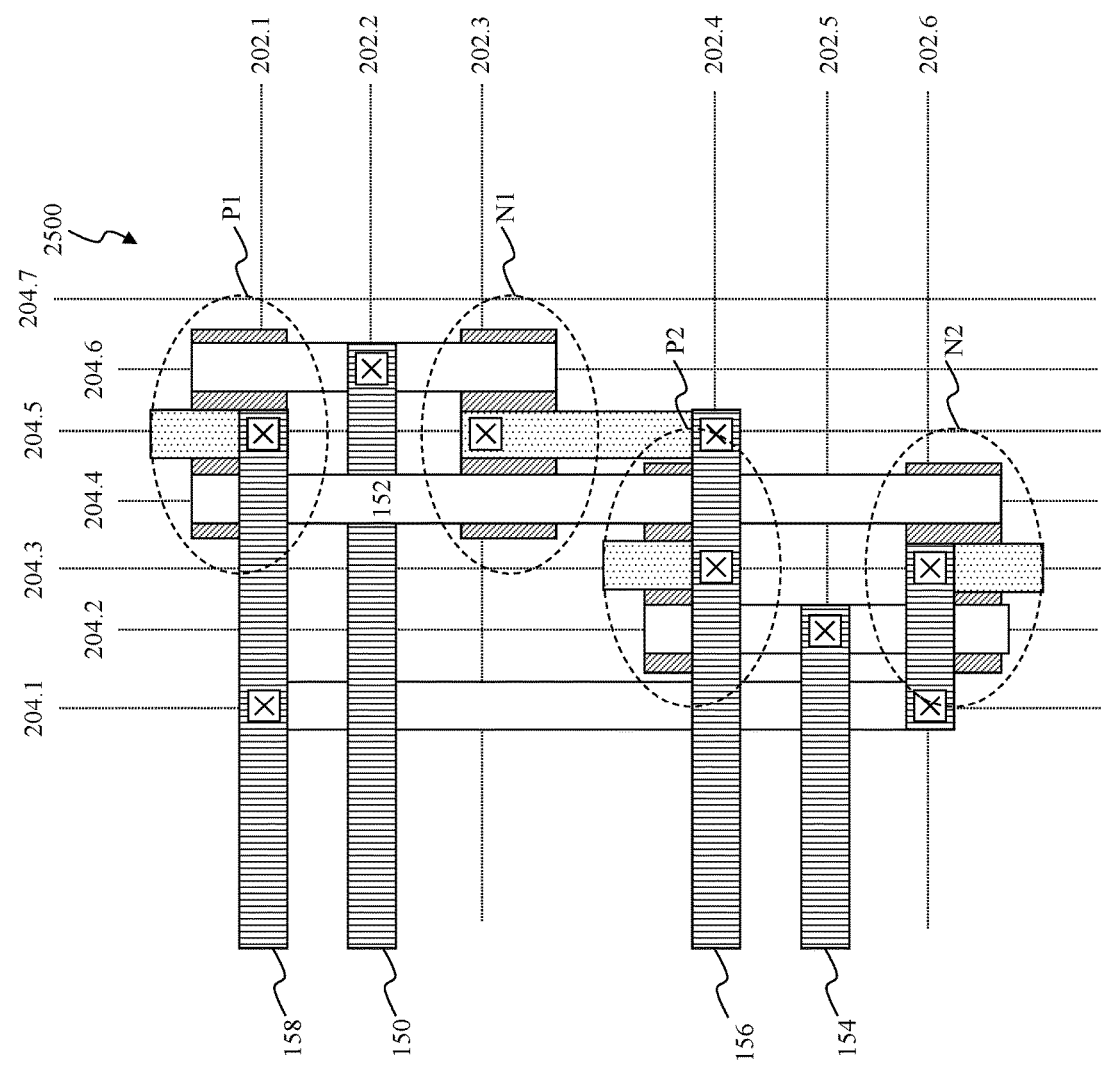

The exemplary integrated circuit layout 500 as illustrated in FIG. 5 through the exemplary integrated circuit layout 2500 as illustrated in FIG. 25 include alternative configurations and arrangements for the PMOS transistor P1, the NMOS transistor N1, the PMOS transistor P2, and the NMOS transistor N2 as illustrated in FIG. 2. In the exemplary embodiment illustrated in FIG. 2, the PMOS transistor P1, the NMOS transistor N1, the PMOS transistor P2, and the NMOS transistor N2 are situated along the row 202.1, the row 202.3, the row 202.4, and the row 202.6, respectively. However, in the exemplary embodiment illustrated in FIG. 5, the NMOS transistor N1, the PMOS transistor P1, the NMOS transistor N2, and the PMOS transistor P2 are alternatively situated along the row 202.1, the row 202.3, the row 202.4, and the row 202.6, respectively, in the exemplary integrated circuit layout 500.

In the exemplary embodiment illustrated in FIG. 2, the PMOS transistor P1, the NMOS transistor N1, the PMOS transistor P2, and the NMOS transistor N2 are situated along the column 204.4. However, in the exemplary embodiment illustrated in FIG. 6, the PMOS transistor P1 is situated along the column 204.6 and the NMOS transistor N1, the PMOS transistor P2, and the NMOS transistor N2 are situated along the column 204.4. In the exemplary embodiment illustrated in FIG. 7, the PMOS transistor P1 and the NMOS transistor N2 are situated along the column 204.6 and the NMOS transistor N1 and the PMOS transistor P2 are situated along the column 204.4. In the exemplary embodiment illustrated in FIG. 8, the NMOS transistor N1 is situated along the column 204.6 and the PMOS transistor P1, the PMOS transistor P2, and the NMOS transistor N2 are situated along the column 204.4. In the exemplary embodiment illustrated in FIG. 9, the NMOS transistor N1 and the PMOS transistor P2 are situated along the column 204.6 and the PMOS transistor P1 and the NMOS transistor N2 are situated along the column 204.4. In the exemplary embodiments illustrated in FIG. 10, FIG. 11, FIG. 14, FIG. 15, and FIG. 18, the NMOS transistor N1 and the PMOS transistor P1 are situated along the column 204.5 and the PMOS transistor P2 and the NMOS transistor N2 are situated along the column 204.3. In the exemplary embodiments illustrated in FIG. 12, FIG. 13, FIG. 16, and FIG. 17, the NMOS transistor N1 and the PMOS transistor P1 are situated along the column 204.6 and the PMOS transistor P2 and the NMOS transistor N2 are situated along the column 204.4. In the exemplary embodiments illustrated in FIG. 10, FIG. 11, FIG. 14, FIG. 15, in FIG. 20, FIG. 21, FIG. 22, FIG. 23, FIG. 24, and FIG. 25, the NMOS transistor N1 and the PMOS transistor P1 are situated along the column 204.5 and the PMOS transistor P2 and the NMOS transistor N2 are situated along the column 204.3.

Figure 26:
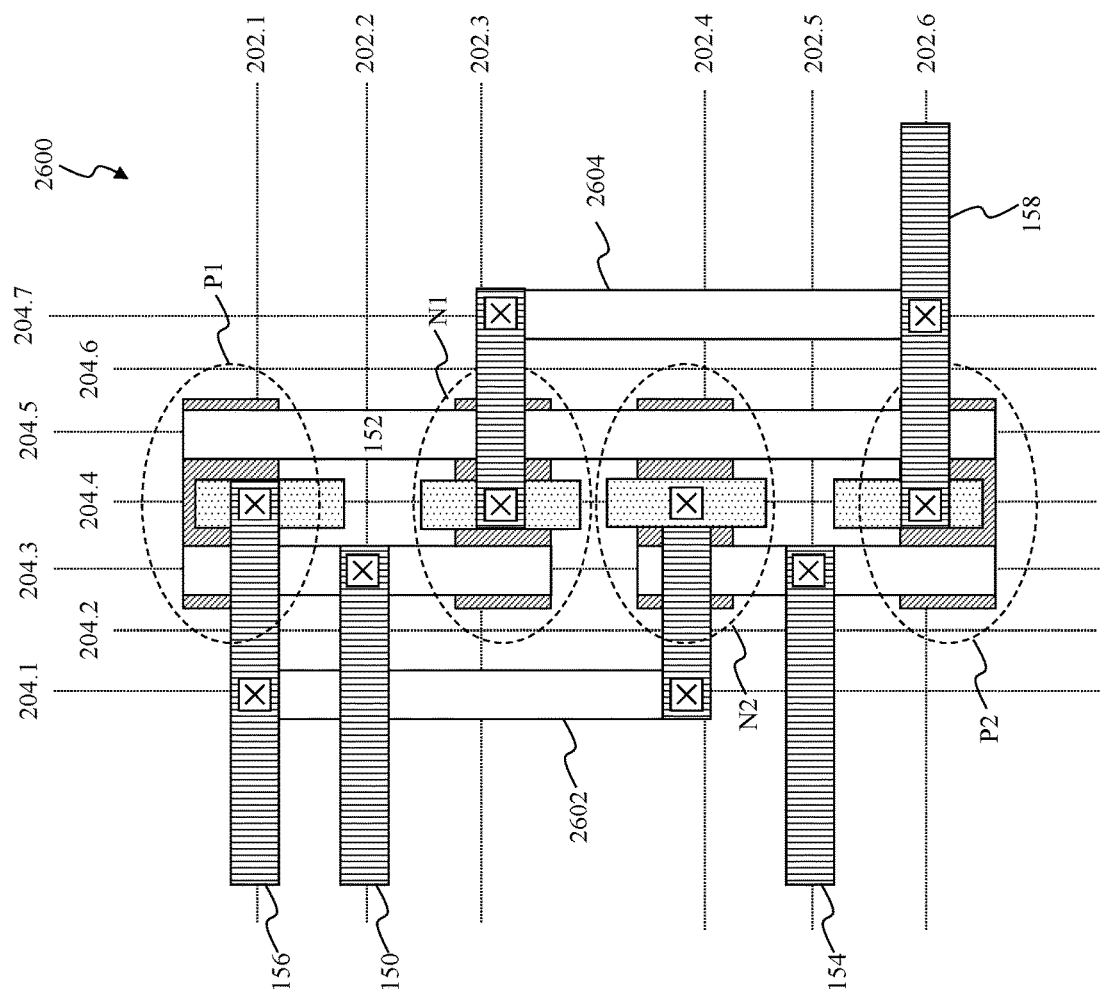
Figure 27:
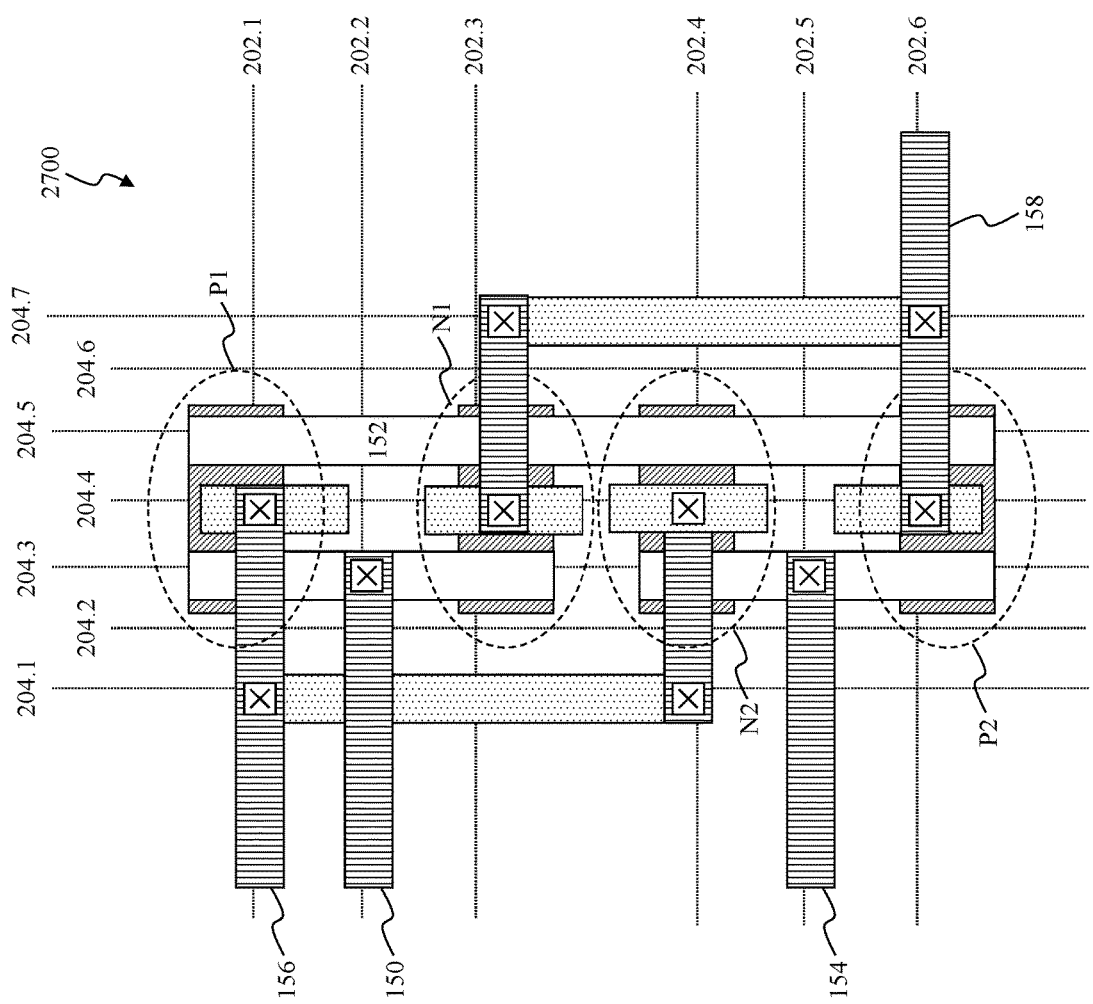
Figure 28:
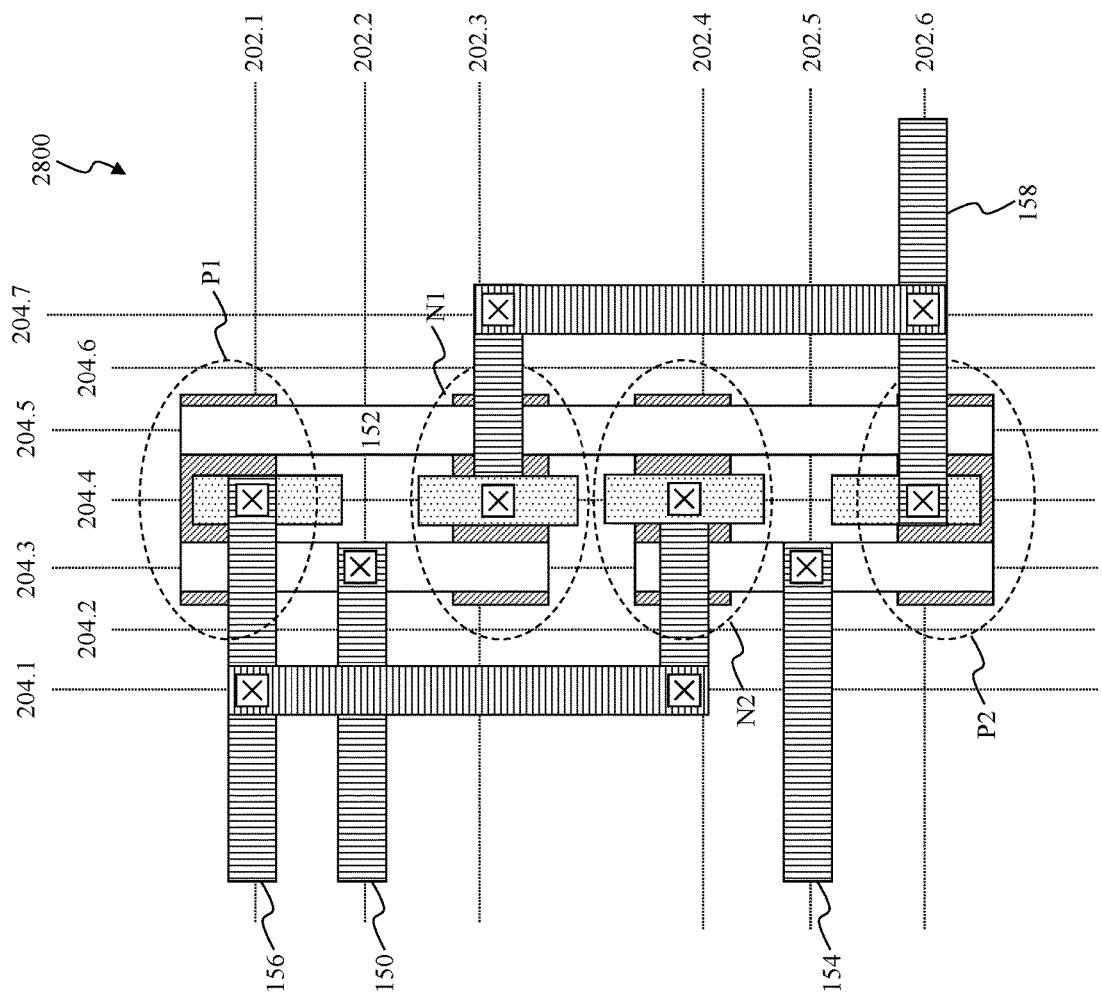
Figure 29:
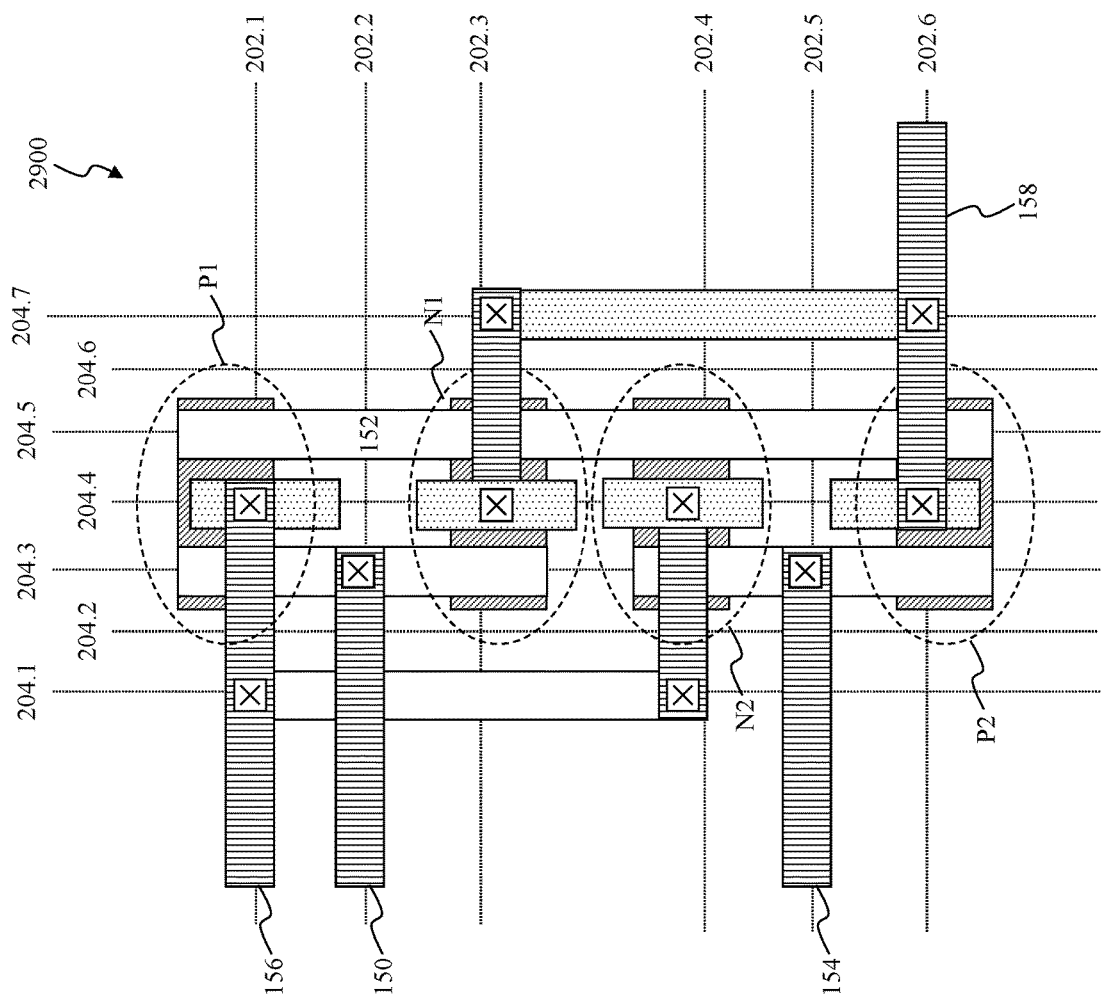
Figure 30:
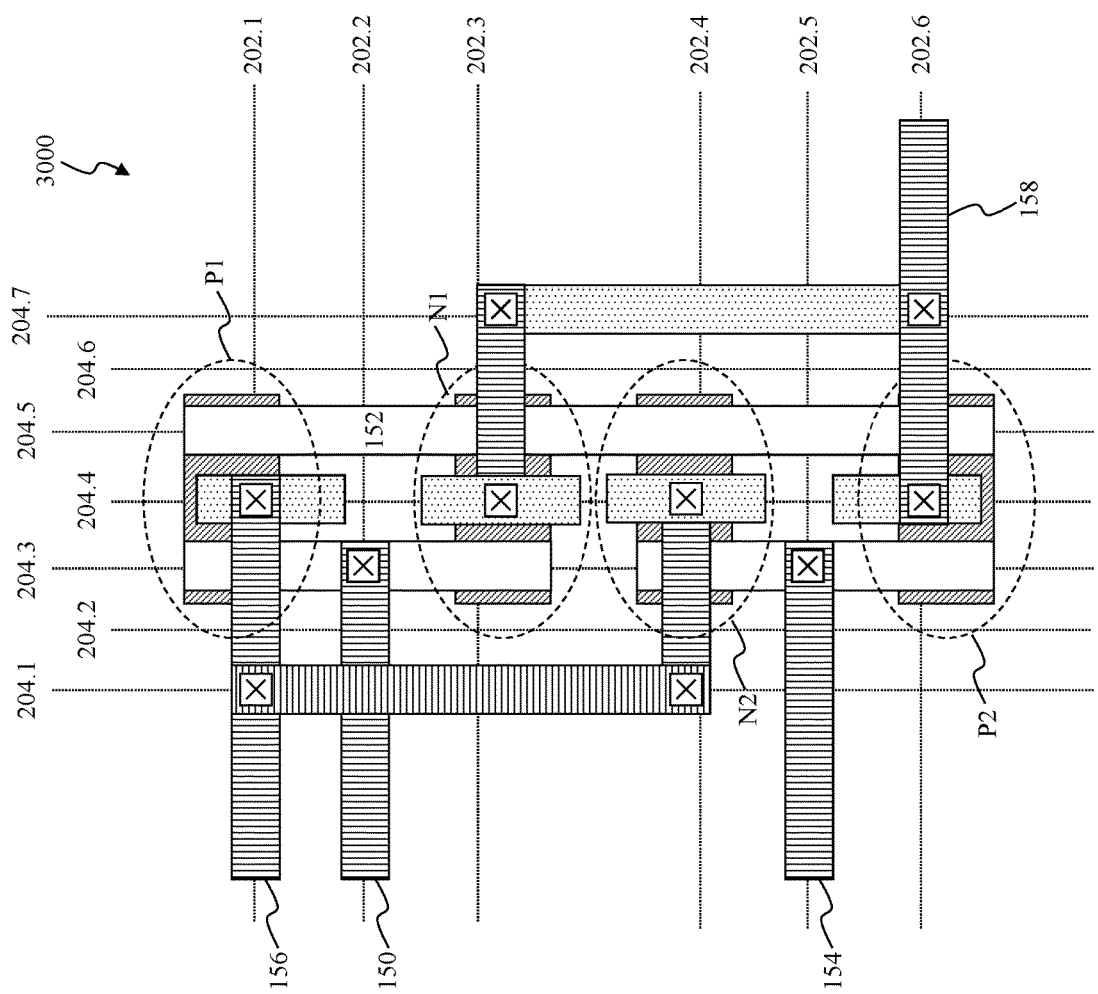
Figure 31:
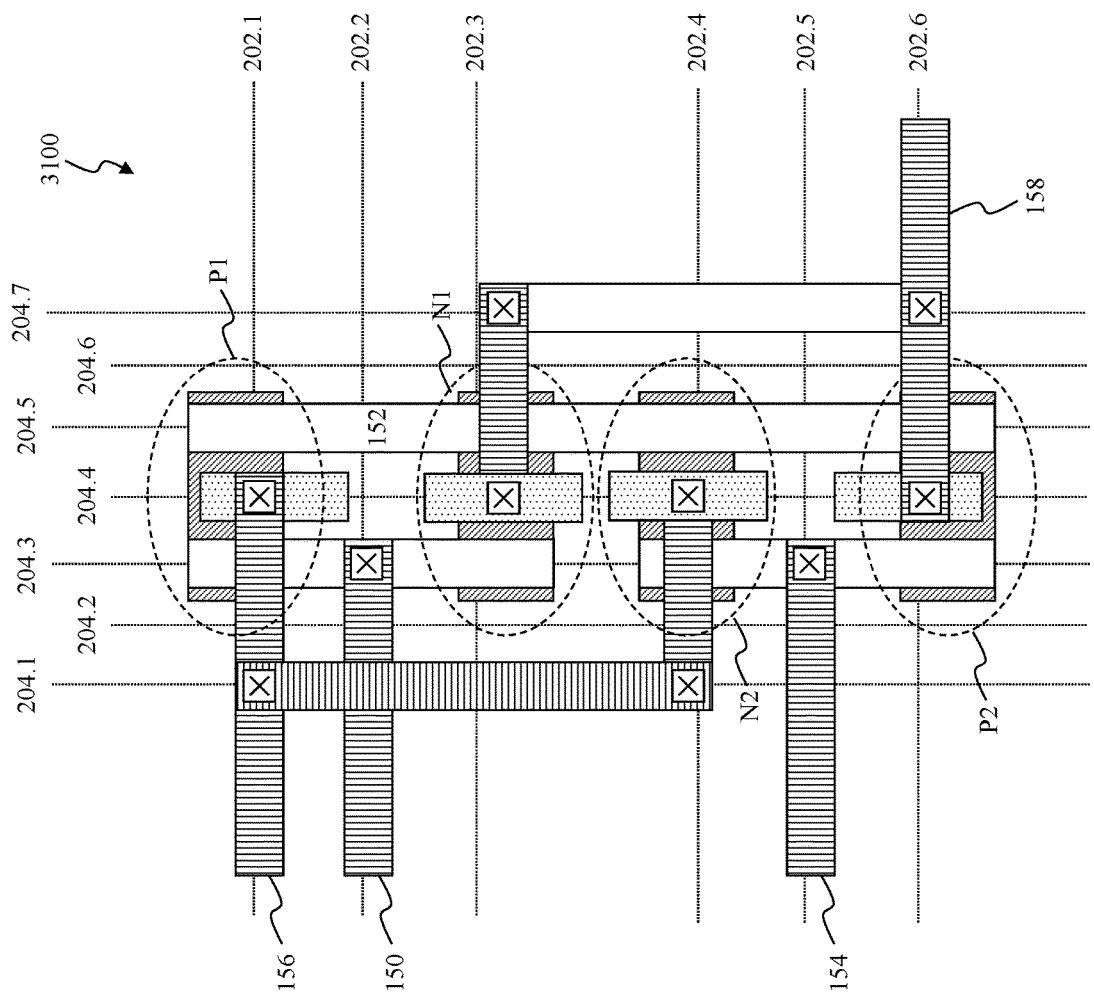
Figure 32:
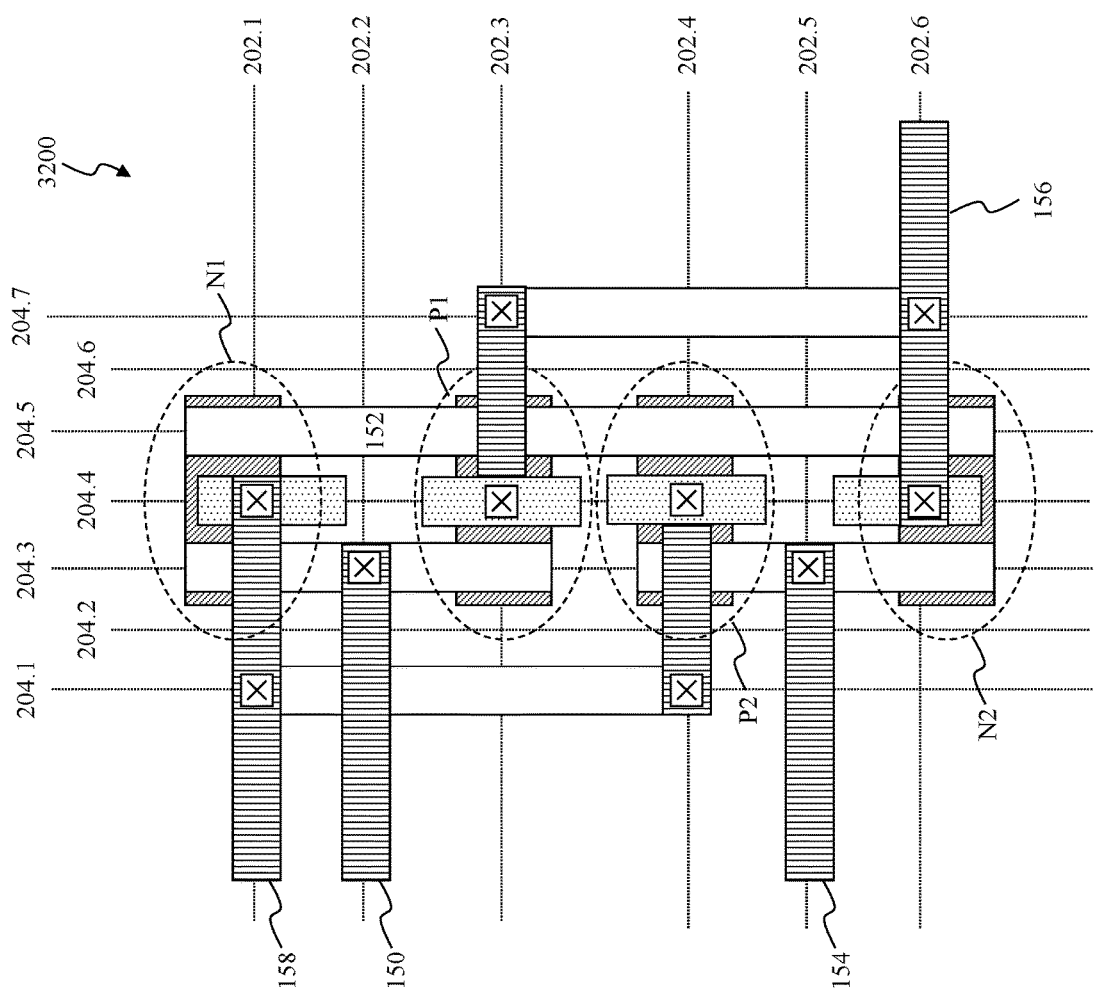

In the exemplary integrated circuit layout 2600 as illustrated in FIG. 26, the first clocking signal 156 and the second clocking signal 158 traverse substantially similar distances to the OD layer of the PMOS transistor P1 and the OD layer of the NMOS transistor N2 and to the OD layer of the NMOS transistor N1 and the OD layer of the PMOS transistor P2, respectively. For example, a length of a conductive region 2602 of the one or more conductive materials situated within the MD layer extending along the column 204.1 in the second direction 252 is equal to, or approximately equal to, a length of a conductive region 2604 of the one or more conductive materials situated within the MD layer extending along the column 204.7. The exemplary integrated circuit layout 2700 as illustrated in FIG. 27, the exemplary integrated circuit layout 2800 as illustrated in FIG. 28, exemplary integrated circuit layout 2900 as illustrated in FIG. 29, the exemplary integrated circuit layout 3000 as illustrated in FIG. 30, the exemplary integrated circuit layout 3100 as illustrated in FIG. 31 and the exemplary integrated circuit layout 3200 as illustrated in FIG. 32 include alternative connections for the first clocking signal 156 and the second clocking signal 158 as illustrated in FIG. 26. In the exemplary embodiment illustrated in FIG. 27, these alternative connections for the first clocking signal 156 and the second clocking signal 158 can be implemented using the polysilicon material situated within the one or more polysilicon layers. In the exemplary embodiment illustrated in FIG. 28, these alternative connections for the first clocking signal 156 and the second clocking signal 158 can be implemented using the one or more conductive materials situated within the second metal layer. In the exemplary embodiment illustrated in FIG. 29, these alternative connections for the first clocking signal 156 can be implemented using the one or more conductive materials situated within the MD layer and the second clocking signal 158 can be implemented using the polysilicon material situated within the one or more polysilicon layers. In the exemplary embodiment illustrated in FIG. 30, these alternative connections for the first clocking signal 156 can be implemented using the one or more conductive materials situated within the second metal layer and the second clocking signal 158 can be implemented using the polysilicon material situated within the one or more polysilicon layers. In the exemplary embodiment illustrated in FIG. 31, these alternative connections for the first clocking signal 156 can be implemented using the one or more conductive materials situated within the second metal layer and the second clocking signal 158 can be implemented using the one or more conductive materials situated within the MD layer. In the exemplary embodiment illustrated in FIG. 32, these alternative connections for the first clocking signal 156 and the second clocking signal 158 can be implemented using the one or more conductive materials situated within the MD layer.

Exemplary Implementation of the Exemplary Dual Transmission Gate

Figure 33:
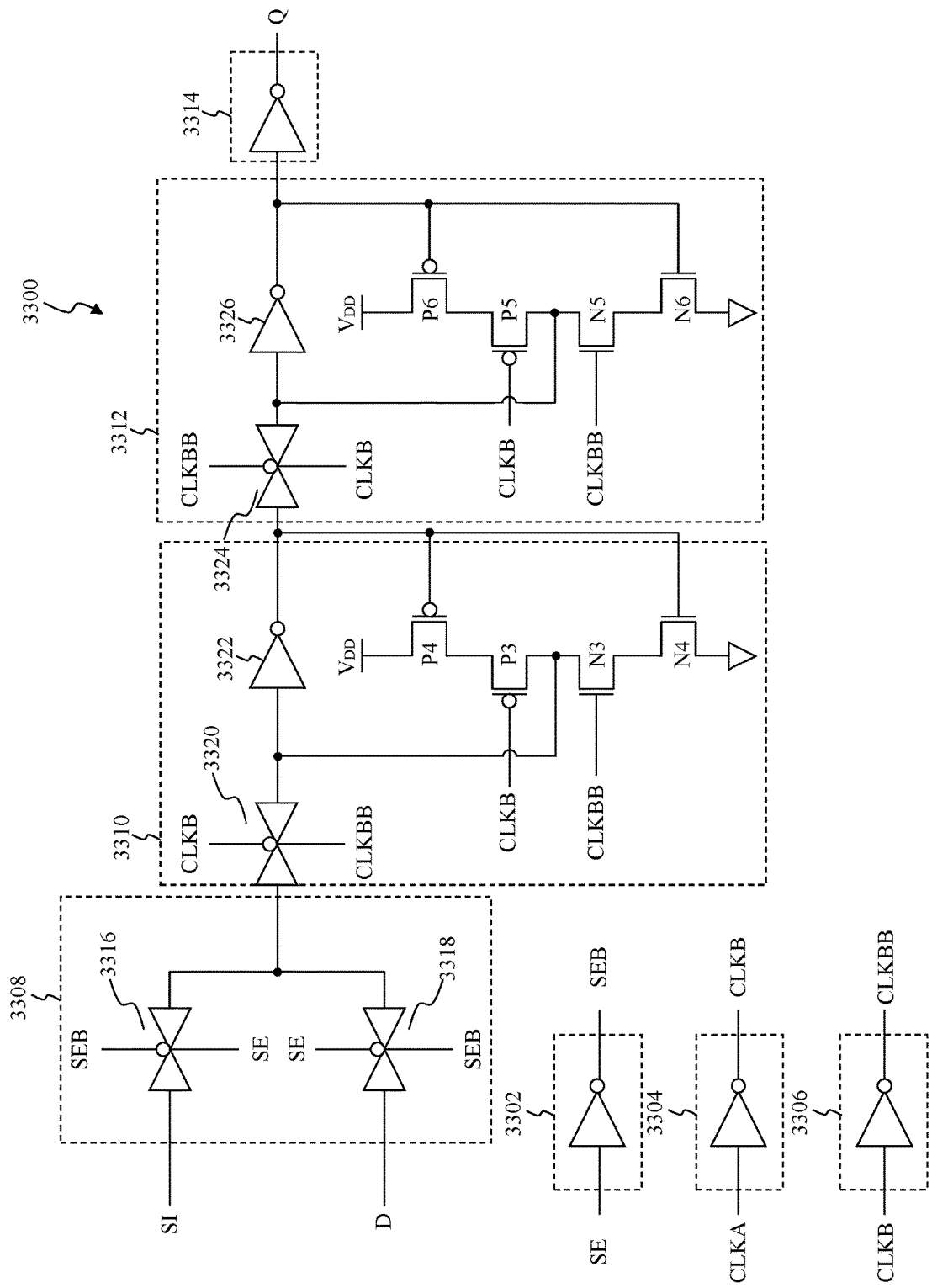
FIG. 33 illustrates a schematic diagram of an exemplary synchronous flip-flop having the exemplary dual transmission gate according to an exemplary embodiment of the present disclosure.

FIG. 33 illustrates a schematic diagram of an exemplary synchronous flip-flop having the exemplary dual transmission gate according to an exemplary embodiment of the present disclosure. In the exemplary embodiment illustrated in FIG. 33, an exemplary flip-flop 3300 can be used to store data (D) to be written to a memory device, such as volatile memory and/or non-volatile memory, and/or to be read from the memory device. The volatile memory can be implemented as random-access memory (RAM), which requires power to maintain its stored information, such as dynamic random-access memory (DRAM), a static random-access memory (SRAM), and/or a non-volatile random-access memory (NVRAM), often referred to as a flash memory, to provide some examples. The non-volatile memory, which can maintain its stored information even when not powered, can be implemented as a programmable read-only memory (PROM), a one-time programmable ROM (OTP), an erasable programmable read-only memory (EPROM) and/or an electrically erasable programmable read-only memory (EEPROM) to provide some examples. As illustrated in FIG. 33, the flip-flop 3300 includes sense enable (SE) circuitry 3302, first clocking circuitry 3304, second clocking circuitry 3306, multiplexing circuitry 3308, master latching circuitry 3310, slave latching circuitry 3312, and output circuitry 3314.

As illustrated in FIG. 33, the SE circuitry 3302 performs a logical inverting operation on a SE control signal, denoted as SE in FIG. 33, to provide a complement of the SE control signal, denoted as SEB in FIG. 33. Similarly, in FIG. 33, the first clocking circuitry 3304 performs a logical inverting operation on a clocking signal, denoted as CLKA in FIG. 33, to provide a complement of the clocking signal, denoted as CLKB in FIG. 33. Likewise, the second clocking circuitry 3306 performs a logical inverting operation on the CLKB to provide a complement of the CLKB, denoted as CLKBB in FIG. 33. Although the SE circuitry 3302, the first clocking circuitry 3304, and the second clocking circuitry 3306 are illustrated using logical INVERTER gates in FIG. 33, those skilled in the relevant art(s) will recognize the SE circuitry 3302, the first clocking circuitry 3304, and the second clocking circuitry 3306 can be similarly implemented using other basic logical gates, such as logical AND gates, logical OR gates, logical XOR gates, and/or logical XNOR gates to provide some examples, and/or combinations of the other basic logical gates without departing from the spirit and scope of the present disclosure.

In the exemplary embodiment, the multiplexing circuitry 3308 selectively provides a stream of data, denoted as D in FIG. 33 and/or a stream of testing data, denoted as sense input (SI) in FIG. 33, to the master latching circuitry 3310. As illustrated in FIG. 33, the multiplexing circuitry 3308 includes a transmission gate 3316 and a transmission gate 3318. The SI represents a known sequence of data that passes through the flip-flop 3300 to be used to operational test the memory device. The transmission gate 3316 selectively provides the SI to the master latching circuitry 3310 in response to the SE being at the first logical level, such as a logical one, and the SEB being at the second logical level, such as a logical zero. The transmission gate 3318 selectively provides the D to the master latching circuitry 3310 in response to the SE being at the second logical level, such as a logical zero, and the SEB being at the first logical level, such as a logical one.

As additionally illustrated in FIG. 33, the master latching circuitry 3310 includes an NMOS transistor N3, an NMOS transistor N4, a PMOS transistor P3, a PMOS transistor P4, a transmission gate 3320, and a logical INVERTER gate 3322. As illustrated in FIG. 33, the transmission gate 3320 aligns the D or the SI from the multiplexing circuitry 3308 with the CLKB and the CLKBB. When the CLKB is at the second logical level, such as a logical zero, the CLKBB is at the first logical level, such as a logical one, the transmission gate 3320 selectively provides the D or the SI from the multiplexing circuitry 3308. In the exemplary embodiment illustrated in FIG. 33, the NMOS transistor N3, the NMOS transistor N4, the PMOS transistor P3, the PMOS transistor P4, and the logical INVERTER gate 3322 are arranged to form a first latch circuit that is responsive to the CLKB and the CLKBB. When the CLKB is at the first logical level, such as a logical one, the CLKBB is at the second logical level, such as a logical zero, the first latch circuit passes the D or the SI from the multiplexing circuitry 3308 onto the slave latching circuitry 3312. Otherwise, when the CLKB is at the second logical level, such as a logical zero, the CLKBB is at the first logical level, the transmission gate 3320 is isolated from the first latch circuit. In this configuration and arrangement, the first latch circuit stores the D or the SI provided by the multiplexing circuitry 3308.

Moreover, the slave latching circuitry 3312 includes an NMOS transistor N5, an NMOS transistor N6, a PMOS transistor P5, a PMOS transistor P6, a transmission gate 3324, and a logical INVERTER gate 3326. As illustrated in FIG. 33, the transmission gate 3324 aligns the D or the SI from the master latching circuitry 3310 with the CLKB and the CLKBB. When the CLKB is at the first logical level, such as a logical one, the CLKBB is at the second logical level, such as a logical zero, the transmission gate 3324 selectively provides the D or the SI from the master latching circuitry 3310. In the exemplary embodiment illustrated in FIG. 33, the NMOS transistor N5, the NMOS transistor N6, the PMOS transistor P5, the PMOS transistor P6, and the logical INVERTER gate 3326 are arranged to form a second latch circuit that is responsive to the CLKB and the CLKBB.

When the CLKB is at the first logical level, such as a logical one, the CLKBB is at the second logical level, such as a logical zero, the second latch circuit passes the D or the SI from the master latching circuitry 3310 onto output circuitry 3314. Otherwise, when the CLKB is at the second logical level, such as a logical zero, the CLKBB is at the first logical level, the transmission gate 3324 is isolated from the second latch circuit. In this configuration and arrangement, the second latch circuit stores the D or the SI provided by the master latching circuitry 3310.

In the exemplary embodiment illustrated in FIG. 33, the output circuitry 3314 performs a logical inverting operation on the D or the SI stored situated within the slave latching circuitry 3312 to provide an output data, denoted as Q in FIG. 33. Although the output circuitry 3314 is illustrated using a logical INVERTER gate in FIG. 33, those skilled in the relevant art(s) will recognize the output circuitry 3314 can be similarly implemented using other basic logical gates, such as logical AND gates, logical OR gates, logical XOR gates, logical XNOR gates, or logical NOT gates to provide some examples, and/or combinations of the other basic logical gates without departing from the spirit and scope of the present disclosure.

Exemplary Real Estate Layout of the Exemplary Synchronous Flip-Flop

Figure 34A:
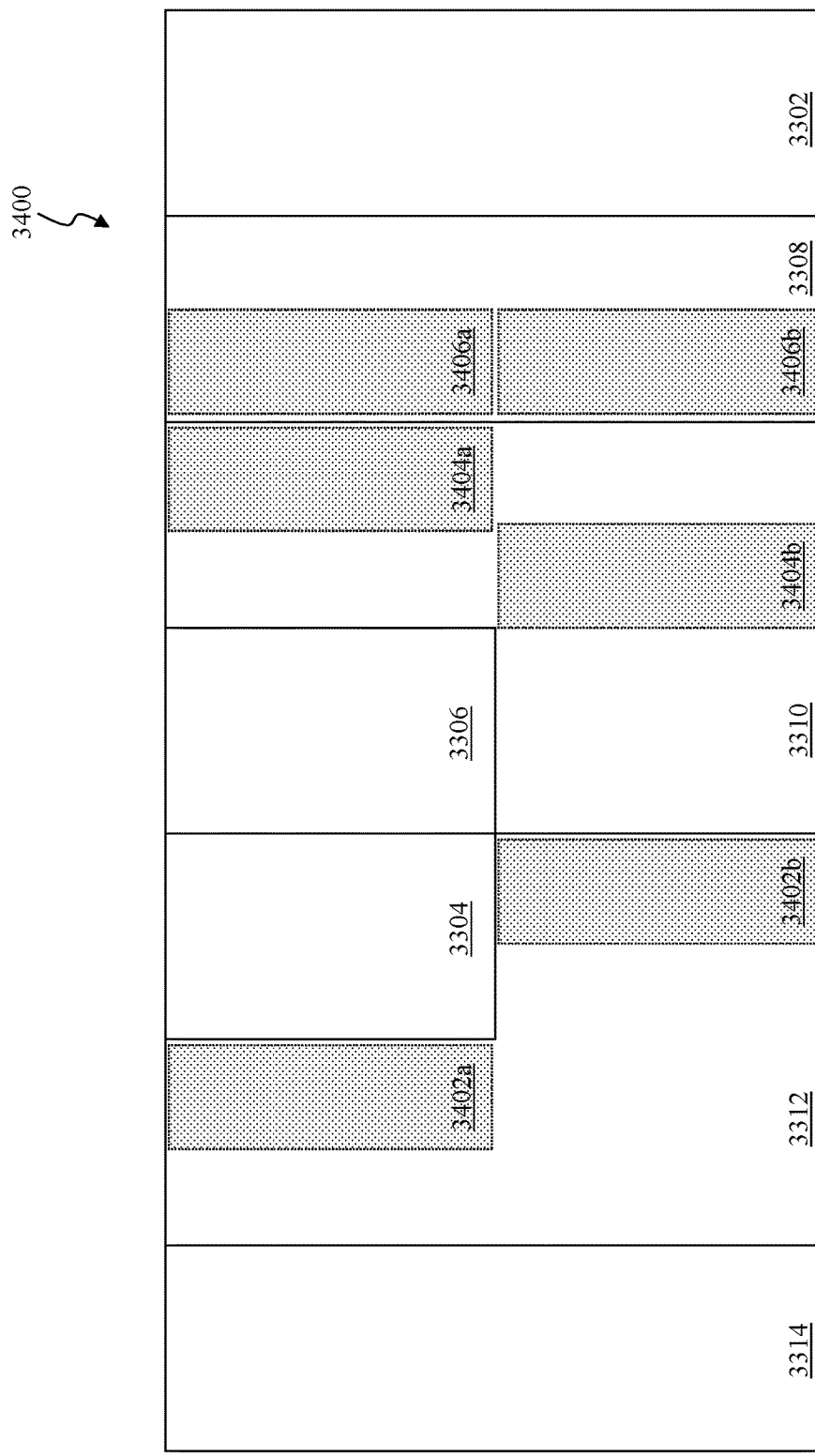
FIG. 34A and FIG. 34B illustrate exemplary layout floor plans of the exemplary synchronous flip-flop according to exemplary embodiments of the present disclosure.
Figure 34B:
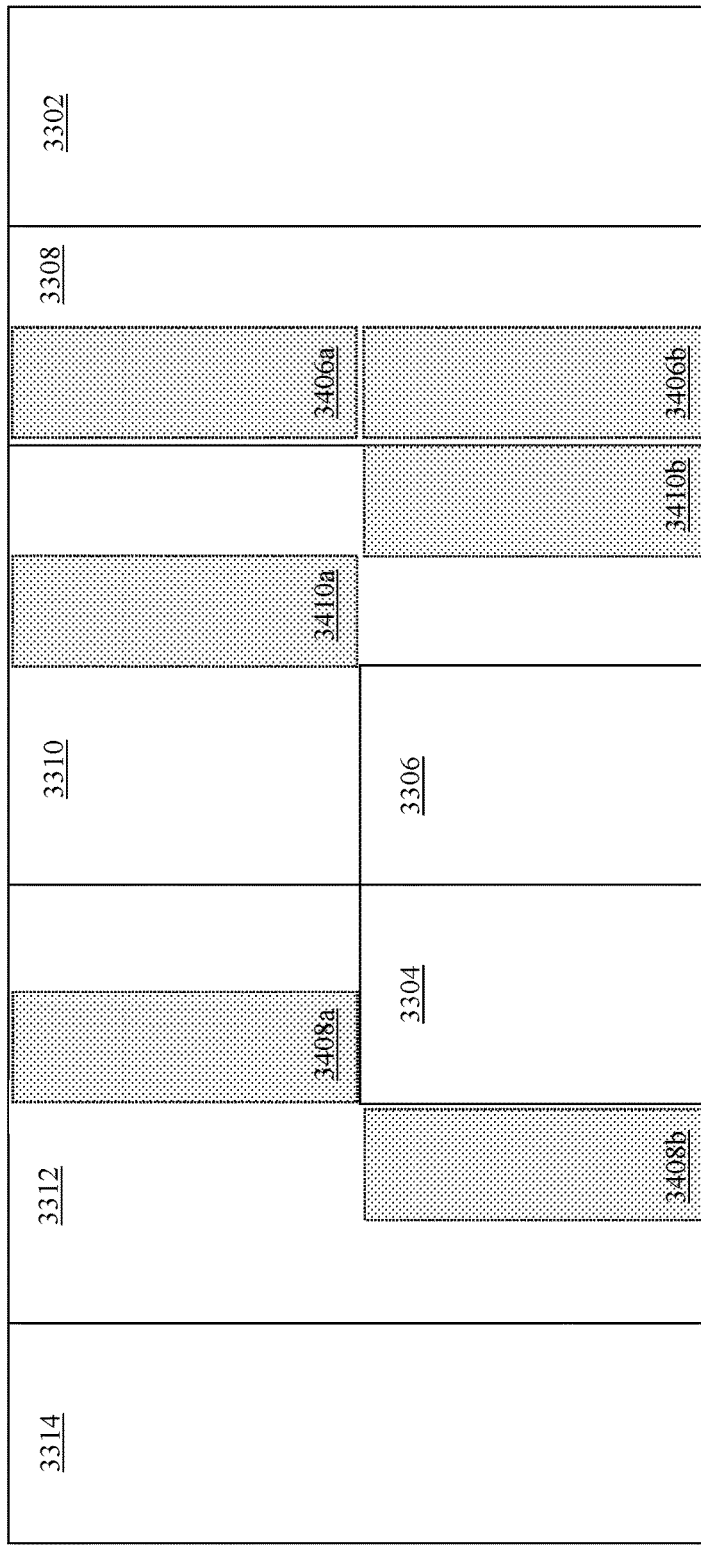

FIG. 34A and FIG. 34B illustrate exemplary layout floor plans of the exemplary synchronous flip-flop according to exemplary embodiments of the present disclosure. The exemplary layout floor plans as illustrated in FIG. 34A and FIG. 34B represent exemplary layout floor plans for the exemplary flip-flop 3300 as described in FIG. 33. As illustrated in FIG. 34A and FIG. 34B, a first exemplary layout floor plan 3400 and a second exemplary layout floor plan 3410, respectively, represent double-height, also referred to as double rule, layout floor plans as described above. These double rule layout floor plans allow the transmission gate 3316, the transmission gate 3318, the transmission gate 3320, and/or the transmission gate 3322 to be implemented using the various exemplary integrated circuit layouts for the exemplary dual transmission gate as described in FIG. 2 through FIG. 32.

In the exemplary embodiment illustrated in FIG. 34A, the first exemplary layout floor plan 3400 includes, starting from the leftmost side, real estate for the output circuitry 3314, the slave latching circuitry 3312, the first clocking circuitry 3304, the second clocking circuitry 3306, the master latching circuitry 3310, the multiplexing circuitry 3308, and the SE circuitry 3302 as described above in FIG. 33. As illustrated in FIG. 34A, the output circuitry 3314, the slave latching circuitry 3312, the master latching circuitry 3310, the multiplexing circuitry 3308, and the SE circuitry 3302 represent double rule layout floor plans and the first clocking circuitry 3304 and the second clocking circuitry 3306 represent single rule layout floor plans. A vertical height of these double rule layout floor plans is twice a vertical height of these single layout floor plans as illustrated in FIG. 34A. Additionally, the real estate for the slave latching circuitry 3312, as illustrated in FIG. 34A, includes real estate 3402a and real estate 3402b allocated for the implementation of the transmission gate 3324 and the real estate for the master latching circuitry 3310 includes real estate 3404a and real estate 3404b allocated for the implementation of the transmission gate 3320. Using various combinations of the real estate 3402a, the real estate 3402b, the real estate 3404a, and the real estate 3404b, the transmission gate 3320 and the transmission gate 3324 can be implemented using the various exemplary integrated circuit layout as described in FIG. 2 through FIG. 32. For example, the real estate 3402b can be allocated to implement the transmission gate 3324 and the real estate 3404a can be allocated to implement the transmission gate 3320. In this example, the transmission gate 3320 includes the PMOS transistor P1 and the NMOS transistor N1 and the transmission gate 3324 includes the PMOS transistor P2 and the PMOS transistor P2 as described in FIG. 10 through FIG. 25. As such, the transmission gate 3320 and the transmission gate 3324 can be implemented using any of the exemplary integrated circuit layout 1000 through the exemplary integrated circuit layout 2500. As another example, the real estate 3402a can be allocated to implement the transmission gate 3324 and the real estate 3404b can be allocated to implement the transmission gate 3320. In this example, the transmission gate 3324 includes the PMOS transistor P1 and the NMOS transistor N1 and the transmission gate 3320 includes the PMOS transistor P2 and the PMOS transistor P2 as described in FIG. 10 through FIG. 25. As such, the transmission gate 3320 and the transmission gate 3324 can be implemented using any of the exemplary integrated circuit layout 1000 through the exemplary integrated circuit layout 2500.

Alternatively, as illustrated in FIG. 34B, the real estate for the slave latching circuitry 3312, as illustrated in FIG. 34A, includes real estate 3408a and real estate 3408b allocated for the implementation of the transmission gate 3324 and the real estate for the master latching circuitry 3310 includes real estate 3410a and real estate 3410b allocated for the implementation of the transmission gate 3320. Using various combinations of the real estate 3408a, the real estate 3408b, the real estate 3410a, and the real estate 3410b, the transmission gate 3320 and the transmission gate 3324 can be implemented using the various exemplary integrated circuit layout as described in FIG. 2 through FIG. 32. For example, the real estate 3408b can be allocated to implement the transmission gate 3324 and the real estate 3410a can be allocated to implement the transmission gate 3320. In this example, the transmission gate 3320 includes the PMOS transistor P1 and the NMOS transistor N1 and the transmission gate 3324 includes the PMOS transistor P2 and the PMOS transistor P2 as described in FIG. 10 through FIG. 25. As such, the transmission gate 3320 and the transmission gate 3324 can be implemented using any of the exemplary integrated circuit layout 1000 through the exemplary integrated circuit layout 2500. As another example, the real estate 3408a can be allocated to implement the transmission gate 3324 and the real estate 3410b can be allocated to implement the transmission gate 3320. In this example, the transmission gate 3324 includes the PMOS transistor P1 and the NMOS transistor N1 and the transmission gate 3320 includes the PMOS transistor P2 and the PMOS transistor P2 as described in FIG. 10 through FIG. 25. As such, the transmission gate 3320 and the transmission gate 3324 can be implemented using any of the exemplary integrated circuit layout 1000 through the exemplary integrated circuit layout 2500.

As illustrated in FIG. 34A and FIG. 34B, the real estate for the multiplexing circuitry 3308 includes real estate 3406a and real estate 3406b allocated for the implementation of the transmission gate 3316 and the transmission gate 3318. Using the real estate 3406a and the real estate 3406a, the transmission gate 3316 and the transmission gate 3318 can be implemented using the various exemplary integrated circuit layout as described in FIG. 2 through FIG. 32. For example, the real estate 3406a can be allocated to implement the transmission gate 3316 and the real estate 3406b can be allocated to implement the transmission gate 3318. In this example, the transmission gate 3316 includes the PMOS transistor P1 and the NMOS transistor N1 and the transmission gate 3318 includes the PMOS transistor P2 and the PMOS transistor P2 as described in FIG. 2 through FIG. 19 or FIG. 26 through FIG. 32. As such, the transmission gate 3316 and the transmission gate 3318 can be implemented using any of the exemplary integrated circuit layout 200 through the exemplary integrated circuit layout 1900 or the exemplary integrated circuit layout 2600 through the exemplary integrated circuit layout 3200.

CONCLUSION

The foregoing Detailed Description discloses a dual transmission gate. The dual transmission gate includes a first p-type metal-oxide-semiconductor field-effect (PMOS) transistor, a first n-type metal-oxide-semiconductor field-effect (NMOS) transistor, a second PMOS transistor, a second NMOS transistor, a first region, a second region, and a third region. The first PMOS transistor is situated within a first row from among a multiple rows of an electronic device design real estate and receives a first clocking signal. The first NMOS transistor is situated within a second row from among the multiple rows and receives a second clocking signal. The second PMOS transistor is situated within a third row from among the multiple rows and receives the second clocking signal. The second NMOS transistor is situated within a fourth row from among the multiple rows and receives the first clocking signal. The first region and the second region corresponds to the first clocking signal and is situated within a first interconnection layer of a semiconductor stack along the first row and the fourth row, respectively. The third region is situated within a second interconnection layer of the semiconductor stack along a first column from among multiple columns of the electronic device design real estate and electrically connects the first region and the second region.

The foregoing Detailed Description additionally discloses another dual transmission gate. This other dual transmission gate includes a first pair of complementary metal-oxide-semiconductor field-effect (CMOS) transistors, a second pair of CMOS transistors, a first region, a second region, a third region, a fourth region, a fifth region, and a sixth region. The first pair of CMOS) transistors is situated within a first column from among multiple columns of an electronic device design real estate and is arranged to form a first transmission gate. The first transmission gate routes a first signal between a first terminal and a second terminal in response to a first clocking signal being at a first logical level and a second clocking signal being at a second logical level. The second pair of CMOS transistors is situated within a second column from among the multiple columns is arranged to form a second transmission gate. The second transmission gate routes a second signal between the second terminal and a third terminal in response to the first clocking signal being at the second logical level and the second clocking signal being at the first logical level. The first region and the second region correspond to the first clocking signal and are situated within a first interconnection layer along a first row and a second row, respectively, from among multiple rows of the electronic device design real estate. The third region is situated within a second interconnection layer of the semiconductor stack along a second column from among the multiple columns of the electronic device design real estate and electrically connects the first region and the second region. The fourth region and the fifth region correspond to the second clocking signal and are situated within the first interconnection layer of the semiconductor stack along a third row and a fourth row, respectively, from among the multiple rows. The sixth region is situated within the second interconnection layer of the semiconductor stack along a third column from among the multiple columns of the electronic device design real estate and electrically connects the fourth region and the fifth region.

The foregoing Detailed Description further discloses a dual transmission gate having a first input terminal, a second input terminal, and an output terminal. This further dual transmission gate includes a first p-type metal-oxide-semiconductor field-effect (PMOS) transistor, a first n-type metal-oxide-semiconductor field-effect (NMOS) transistor, a second PMOS transistor, a second NMOS transistor, a first region, a second region, and a third region. The first PMOS transistor has a first source/drain region corresponding to the first input terminal, a second source/drain region corresponding to the output terminal, and a first gate region which receives a first clocking signal. The first NMOS transistor has a third source/drain region corresponding to the first input terminal, a fourth source/drain region corresponding to the output terminal, and a second gate region which receives a second clocking signal. The second PMOS transistor has a fifth source/drain region corresponding to the second input terminal, a sixth source/drain region corresponding to the output terminal, and a third gate region which receives the first clocking signal. The second NMOS transistor has a seventh source/drain region corresponding to the second input terminal, an eighth source/drain region corresponding to the output terminal, and a fourth gate region which receives the second clocking signal. The first region and the second region correspond to the first clocking signal and are situated within a first interconnection layer of a semiconductor stack along a first row and a second row, respectively, from among a multiple rows of an electronic device design real estate. The third region is situated within a second interconnection layer of the semiconductor stack along a first column from among multiple columns of the electronic device design real estate and electrically connects the first region and the second region.

The foregoing Detailed Description referred to accompanying figures to illustrate exemplary embodiments consistent with the disclosure. References in the foregoing Detailed Description to "an exemplary embodiment" indicates that the exemplary embodiment described can include a particular feature, structure, or characteristic, but every exemplary embodiment may not necessarily include the particular feature, structure, or characteristic. Moreover, such phrases are not necessarily referring to the same exemplary embodiment. Further, any feature, structure, or characteristic described in connection with an exemplary embodiment can be included, independently or in any combination, with features, structures, or characteristics of other exemplary embodiments whether or not explicitly described.

The foregoing Detailed Description is not meant to limiting. Rather, the scope of the disclosure is defined only in accordance with the following claims and their equivalents. It is to be appreciated that the foregoing Detailed Description, and not the following Abstract section, is intended to be used to interpret the claims. The Abstract section can set forth one or more, but not all exemplary embodiments, of the disclosure, and thus, is not intended to limit the disclosure and the following claims and their equivalents in any way.

The exemplary embodiments described within foregoing Detailed Description have been provided for illustrative purposes, and are not intended to be limiting. Other exemplary embodiments are possible, and modifications can be made to the exemplary embodiments while remaining within the spirit and scope of the disclosure. The foregoing Detailed Description has been described with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

Embodiments of the disclosure can be implemented in hardware, firmware, software, or any combination thereof. Embodiments of the disclosure can also be implemented as instructions stored on a machine-readable medium, which can be read and executed by one or more processors. A machine-readable medium can include any mechanism for storing or transmitting information in a form readable by a machine (e.g., a computing circuitry). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

The foregoing Detailed Description fully revealed the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

What is claimed is:

1. A dual transmission gate, comprising:
a first pair of complementary metal-oxide-semiconductor field-effect (CMOS) transistors that is arranged to form a first transmission gate, the first transmission gate being configured to route a first signal between a first terminal and a second terminal in response to a first clocking signal being at a first logical level and a second clocking signal being at a second logical level, the first pair of CMOS transistors including a first p-type metal-oxide-semiconductor field-effect (PMOS) transistor that is situated along a first column or a second column from among a plurality of columns of an electronic device design real estate and a first n-type metal-oxide-semiconductor field-effect (NMOS) transistor that is situated along the first column or the second column;
a second pair of CMOS transistors that is arranged to form a second transmission gate, the second transmission gate being configured to route a second signal between the second terminal and a third terminal in response to the first clocking signal being at the second logical level and the second clocking signal being at the first logical level, the second pair of CMOS transistors including a second PMOS transistor that is situated along the first column or the second column and a second NMOS transistor that is situated along the first column or the second column;
a first region, corresponding to the first clocking signal, situated along a first interconnection layer of a semiconductor stack along a first row from among a plurality of rows of the electronic device design real estate, the first region being connected to the first PMOS transistor and the second NMOS transistor;
a second region, corresponding to the first terminal, situated along the first interconnection layer along a second row from among the plurality of rows of the electronic device design real estate and connected to the first PMOS transistor and the first NMOS transistor;
a third region, corresponding to the second terminal, situated along a second interconnection layer of the semiconductor stack along a second column from among the plurality of columns and connected to the first pair of CMOS transistors and the second pair of CMOS transistors;
a fourth region, corresponding to the second clocking signal, situated along the first interconnection layer along a third row from among the plurality of rows of the electronic device design real estate and connected to the first NMOS transistor and the second PMOS transistor; and
a fifth region, corresponding to the third terminal, situated along the first interconnection layer along a fourth row from among the plurality of rows of the electronic device design real estate and connected to the second PMOS transistor and the second NMOS transistor.

2. The dual transmission gate of claim 1, wherein the first interconnection layer comprises:
a first metal layer of the semiconductor stack, and
wherein the second interconnection layer comprises:
a polysilicon layer of the semiconductor stack;
an oxide diffusion (OD) layer of the semiconductor stack; or
a second metal layer of the semiconductor stack.

3. The dual transmission gate of claim 1, wherein the first PMOS transistor is situated along the second column and the first NMOS transistor is situated along the first column, and
wherein the second PMOS transistor is situated along the first column and the second NMOS transistor is situated along the first column.

4. The dual transmission gate of claim 1, wherein the first PMOS transistor is situated along the second column and the first NMOS transistor is situated along the first column, and
wherein the second PMOS transistor is situated along the first column and the second NMOS transistor is situated along the second column.

5. The dual transmission gate of claim 1, wherein the first PMOS transistor is situated along the first column and the first NMOS transistor is situated along the second column, and
wherein the second PMOS transistor is situated along the first column and the second NMOS transistor is situated along the first column.

6. The dual transmission gate of claim 1, wherein the first PMOS transistor is situated along the first column and the first NMOS transistor is situated along the second column, and
wherein the second PMOS transistor is situated along the first column and the second NMOS transistor is situated along the second column.

7. A dual transmission gate, comprising:
a first pair of transistors including a first transistor that is situated along a first column or a second column from among a plurality of columns of an electronic device design real estate and a second transistor that is situated along the first column or the second column;
a second pair of transistors including a third transistor that is situated along the first column or the second column and a fourth transistor that is situated along the first column or the second column;
a first region situated along a first interconnection layer of a semiconductor stack along a first row from among a plurality of rows of the electronic device design real estate and connected to the first transistor and the fourth transistor;
a second region, corresponding to a first terminal of the dual transmission gate, situated along the first interconnection layer along a second row from among the plurality of rows of the electronic device design real estate and connected to the first transistor and the second transistor;
a third region situated along a second interconnection layer of the semiconductor stack along a second column from among the plurality of columns and connected to the first pair of transistors and the second pair of transistors;
a fourth region situated along the first interconnection layer along a third row from among the plurality of rows of the electronic device design real estate and connected to the second transistor and the third transistor; and
a fifth region, corresponding to a second terminal of the dual transmission gate, situated along the first interconnection layer along a fourth row from among the plurality of rows of the electronic device design real estate and connected to the third transistor and the fourth transistor.

8. The dual transmission gate of claim 7, wherein the first interconnection layer comprises:
a first metal layer of the semiconductor stack, and
wherein the second interconnection layer comprises:
a polysilicon layer of the semiconductor stack;
an oxide diffusion (OD) layer of the semiconductor stack; or
a second metal layer of the semiconductor stack.

9. The dual transmission gate of claim 7, wherein the first transistor is situated along the second column and the second transistor is situated along the first column, and
wherein the third transistor is situated along the first column and the fourth transistor is situated along the first column.

10. The dual transmission gate of claim 7, wherein the first transistor is situated along the second column and the second transistor is situated along the first column, and
wherein the third transistor is situated along the first column and the fourth transistor is situated along the second column.

11. The dual transmission gate of claim 7, wherein the first transistor is situated along the first column and the second transistor is situated along the second column, and
wherein the third transistor is situated along the first column and the fourth transistor is situated along the first column.

12. The dual transmission gate of claim 7, wherein the first transistor is situated along the first column and the second transistor is situated along the second column, and
wherein the third transistor is situated along the first column and the fourth transistor is situated along the second column.

13. The dual transmission gate of claim 7, wherein the first transistor comprises a first p-type metal-oxide-semiconductor field-effect (PMOS) transistor,
wherein the second transistor comprises a first n-type metal-oxide-semiconductor field-effect (NMOS) transistor,
wherein the third transistor comprises a second PMOS transistor, and
wherein the fourth transistor comprises a second NMOS transistor.

14. A dual transmission gate, comprising:
a first pair of transistors including a first transistor that is connected to a first region situated along a first interconnection layer of a semiconductor stack along a first row from among a plurality of rows of an electronic device design real estate and a second transistor that is connected to a second region situated along the first interconnection layer along a second row from among the plurality of rows;
a third region, situated along the first interconnection layer along a third row from among the plurality of rows of the electronic device design real estate, that corresponds to a first terminal of the dual transmission gate and is connected to the first transistor and the second transistor;
a second pair of transistors including a third transistor from among the second pair of transistors that is connected to the first region and a fourth transistor from among the second pair of transistors that is connected to the second region;
a fourth region, situated along the first interconnection layer along a fourth row from among the plurality of rows of the electronic device design real estate, that corresponds to a second terminal of the dual transmission gate and is connected to the third transistor and the fourth transistor; and
a fifth region, situated along a second interconnection layer of the semiconductor stack along a first column from among a plurality of columns of the electronic device design real estate, that is connected to the first pair of transistors and the second pair of transistors.

15. The dual transmission gate of claim 14, wherein the first interconnection layer comprises:
a first metal layer of the semiconductor stack, and
wherein the second interconnection layer comprises:
a polysilicon layer of the semiconductor stack;
an oxide diffusion (OD) layer of the semiconductor stack; or
a second metal layer of the semiconductor stack.

16. The dual transmission gate of claim 14, wherein the first transistor is situated along a second column from among the plurality of columns and the second transistor is situated along a third column from among the plurality of columns, and
wherein the third transistor is situated along the third column and the fourth transistor is situated along the third column.

17. The dual transmission gate of claim 14, wherein the first transistor is situated along a second column from among the plurality of columns and the second transistor is situated along a third column from among the plurality of columns, and wherein the third transistor is situated along the third column and the fourth transistor is situated along the second column.

18. The dual transmission gate of claim 14, wherein the first transistor is situated along a second column from among the plurality of columns and the second transistor is situated along a third column from among the plurality of columns, and wherein the third transistor is situated along the second column and the fourth transistor is situated along the second column.

19. The dual transmission gate of claim 14, wherein the first transistor is situated along a second column from among the plurality of columns and the second transistor is situated along a third column from among the plurality of columns, and wherein the third transistor is situated along the second column and the fourth transistor is situated along the third column.

20. The dual transmission gate of claim 14, wherein the first transistor comprises a first p-type metal-oxide-semiconductor field-effect (PMOS) transistor, wherein the second transistor comprises a first n-type metal-oxide-semiconductor field-effect (NMOS) transistor, wherein the third transistor comprises a second PMOS transistor, and wherein the fourth transistor comprises a second NMOS transistor.

\* \* \* \* \*